US010565326B2

(12) United States Patent
Bremner

(10) Patent No.: US 10,565,326 B2
(45) Date of Patent: Feb. 18, 2020

(54) METHODS AND SYSTEMS FOR DETERMINING RESPONSE OF A REVERBERANT SYSTEM

(71) Applicant: SoneLite Inc., Del Mar, CA (US)

(72) Inventor: Paul Graeme Bremner, Del Mar, CA (US)

(73) Assignee: SONELITE INC., Del Mar, CA (US)

( * ) Notice: Subject to any disclaimer, the term of this patent is extended or adjusted under 35 U.S.C. 154(b) by 646 days.

(21) Appl. No.: 14/906,538

(22) PCT Filed: Jul. 29, 2014

(86) PCT No.: PCT/US2014/048744
§ 371 (c)(1),
(2) Date: Jan. 20, 2016

(87) PCT Pub. No.: WO2015/017469
PCT Pub. Date: Feb. 5, 2015

(65) Prior Publication Data
US 2016/0179997 A1 Jun. 23, 2016

Related U.S. Application Data

(60) Provisional application No. 61/860,116, filed on Jul. 30, 2013.

(51) Int. Cl.
*B64G 1/14* (2006.01)
*G06F 17/50* (2006.01)
*G06F 17/18* (2006.01)

(52) U.S. Cl.
CPC .......... *G06F 17/5009* (2013.01); *G06F 17/18* (2013.01)

(58) Field of Classification Search
CPC ....... G06F 17/5009; G06F 17/18; G01H 7/00; G01H 13/00
See application file for complete search history.

(56) References Cited

U.S. PATENT DOCUMENTS

| 6,090,147 A | 7/2000 | Bremner et al. |
| 2002/0114483 A1 | 8/2002 | Azima et al. |

(Continued)

FOREIGN PATENT DOCUMENTS

| JP | 2008241308 A | 10/2008 |
| JP | 2010108456 | * 5/2010 |

OTHER PUBLICATIONS

Translation JP2010108456A Method of optimizing partial structure.*

(Continued)

*Primary Examiner* — Brian W Wathen
*Assistant Examiner* — Abdou K Seye
(74) *Attorney, Agent, or Firm* — Lorenz & Kopf, LLP

(57) ABSTRACT

Methods and systems are provided for determining a maximum expected response of a reverberant wavefield system to an excitation, where there is uncertainty in both the excitation and the dynamic properties of the system. An exemplary method of characterizing a reverberant response associated with an reverberant subsystem involves determining a first variance associated with an excitation energy exposed to the reverberant subsystem, determining a second variance associated with an effective damping loss factor of the reverberant subsystem, determining a third variance associated with an input modal power acceptance of the reverberant subsystem—and for multiple connected subsystems, determining a fourth variance associated with a coupling loss factor of the coupled subsystems—determining a cumulative variance associated with the reverberant response based on the first variance, the second variance, and the third variance, and displaying an output influenced by the cumulative variance on a display device.

19 Claims, 16 Drawing Sheets

(56) References Cited

U.S. PATENT DOCUMENTS

| | | | |
|---|---|---|---|
| 2003/0098696 A1 | 5/2003 | Li et al. | |
| 2006/0245601 A1* | 11/2006 | Michaud | G01S 5/22 |
| | | | 381/92 |
| 2011/0096906 A1 | 4/2011 | Langeveld | |
| 2012/0265464 A1* | 10/2012 | Langley | G06F 17/5018 |
| | | | 702/65 |
| 2015/0143919 A1* | 5/2015 | Nakano | G01F 1/66 |
| | | | 73/861.28 |

OTHER PUBLICATIONS

Egon Geerardyn et al . "Design of Quasi-Logarithmic Multisine Excitations for Robust Broad Frequency Band Measurements", p. 1364-1372 (Year: 2013).*

Marc Delcroix, et al., "Static and Dynamic Variance Compensation for Recognition of Reverberant Speech With Dereverberation Preprocessing," IEEE Transactions on Audio, Speech and Language Processing, vol. 17, No. 2, Feb. 2009, pp. 324-334, ISSN: 1558-7916, DOI: 10.1109/TASL.2008.2010214.

Jan S. Erkelens, et al., "Correlation-Based and Model-Based Blind Single-Channel Late-Reverberation Suppression in Noisy Time-Varying Acoustical Environments," IEEE Transactions on Audio, Speech, and Language Processing, vol. 18, No. 7, Sep. 2010, pp. 1746-1765, ISSN: 1558-7916, DOI: 10.1109/TASL.2010.2051271.

Alastair W M Brown, The Ensemble Statistics of the Response of Structural Components with Uncertain Properties, A dissertation submitted to the University of Cambridge for the degree of Doctor of Philosophy, Mar. 2003, Retrieved from the Internet: http://www-g.eng.cam.ac.uk/dv_library/Theses/alastairthesis.PDF.

R.H. Lyon, Statistical analysis of power injection and response in structures and rooms, Jnl. Acoust. Soc. Amer. (1969) 45(3), 545-565.

R.S. Langley and A.W.M. Brown, The ensemble statistics of the energy of a random system subjected to harmonic excitation, Jnl. Sound & Vibration (2004) 275, 823-846.

R.S. Langley. and A.W.M. Brown, The ensemble statistics of a band-averaged energy of a random system, Jnl. Sound and Vibration, 275, pp. 847-857, 2004.

P.J. Shorter and R.S. Langley, On the reciprocity relationship between direct field radiation and diffuse reverberant loading, Journal of the Acoustical Society of America, vol. 117, pp. 85-95, 2005.

Cotoni, V., Langley, R. S and Kidner, M.R.F., Numerical and Experimental Validation of Variance Prediction in the Statistical Energy Analysis of Built-up Systems, Jnl. Sound and Vibration (288), 2005.

Langley, R.S, and Cotoni, V., Response variance prediction for uncertain vibro-acoustic systems using a hybrid deterministic-statistical method, J. Acoust. Soc. Am. 122 Dec. 6, 2007.

Langley, R.S., A Reciprocity Approach for Computing the Response of Wiring Systems to Diffuse Electromagnetic Fields, IEEE Transactions on Electromagnetic Compatibility, vol. 52, No. 4, Nov. 2010.

* cited by examiner

FIG. 9
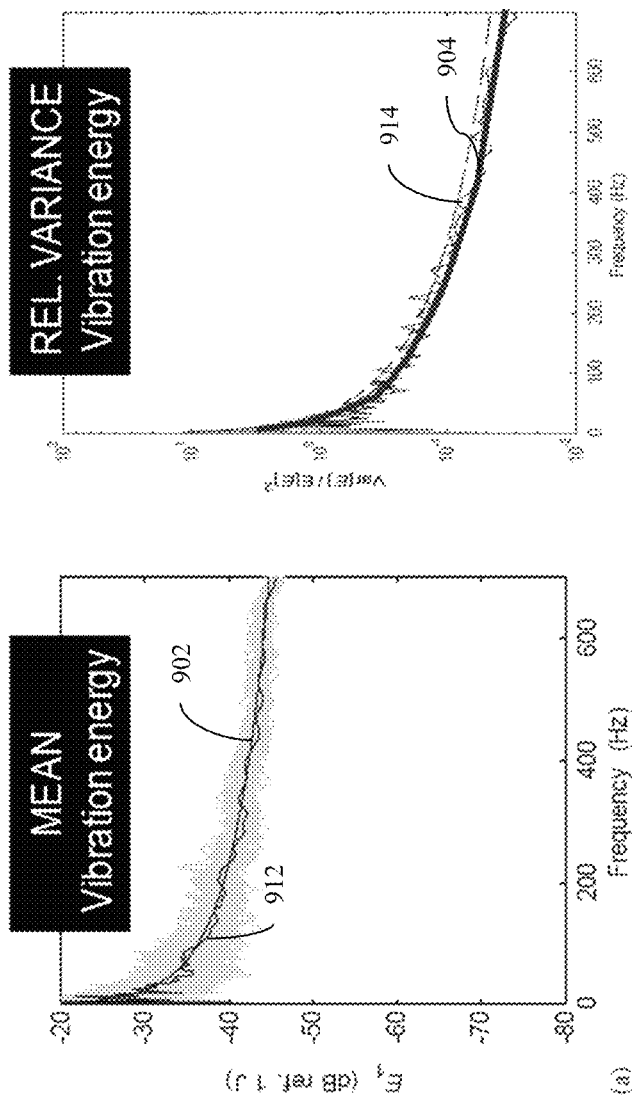
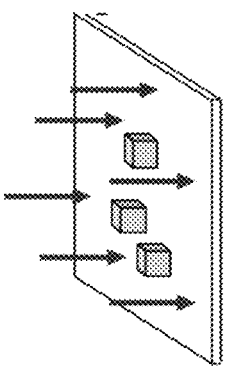

METHODS AND SYSTEMS FOR DETERMINING RESPONSE OF A REVERBERANT SYSTEM

CROSS-REFERENCE TO RELATED APPLICATION(S)

This application is a U.S. National-Stage entry under 35 U.S.C. § 371 based on International Application No. PCT/US2014/048744, filed on Jul. 29, 2014, and which claims priority to U.S. Provisional Patent Application No. 61/860,116, filed Jul. 30, 2013, which are all hereby incorporated in their entirety by reference.

TECHNICAL FIELD

Embodiments of the subject matter described herein relate generally to determining maximum expected levels of a reverberant response of a wave dynamic system to applied excitations.

BACKGROUND

Engineers often need to be able to estimate or predict the real-world dynamic environment in which a device or component will operate in, so that so that an engineer can design and test the device or component for reliable operation in that environment. For example, electrical engineers may need to estimate the maximum electromagnetic wavefield strength in which an electronic component, device, or system must operate, so that they can design and test for immunity to electromagnetic interference. When electronics are housed within an enclosure, the electromagnetic field within the enclosure will become reverberant at higher frequencies (e.g., based on the wavelength relative to the dimensions of the enclosure), at which point electromagnetic wave reflections accumulate to create a multi-modal, reverberant response usually quantified by the total wavefield energy level. The reverberant energy level can typically only be quantified statistically because either the excitation is random or uncertain or because the exact modal parameters of the enclosure (which are dictated by the enclosure's dimensions and electromagnetic properties) are uncertain.

As another example, in the field of vibro-acoustics, engineers may need to estimate the maximum vibration level that sensitive equipment and/or payloads will experience during operation. For example, mechanical engineers designing a rocket or launch vehicle need to be able to estimate the maximum vibration level that is likely to be experienced in transonic flight, so that they can design and test for safe operation of the equipment in flight. The vibration wavefield response of the structural panels of the vehicle may be driven by unsteady aerodynamics forces during transonic flight. Again, the vibrational waves in the vehicle structural panel subsystems will reflect and scatter at higher frequencies, at which point the vibrations accumulate to create a reverberant vibrational energy level.

While various statistical energy analysis methods exist and can be employed to estimate the mean or average reverberant energy level, care must be taken so as not to underestimate the statistical variance about the mean, and the resulting maximum expected reverberant energy level, as any gross under estimation of maximum expected response at the design stage will lead to equipment failures in the operating environment. At the same time, any gross overestimate of the reverberant energy level can make it cost prohibitive to design devices or components for the estimated reverberant energy level. Accordingly, it is desirable to calculate or otherwise estimate the reverberant energy level in an accurate and reliable manner without grossly overestimating or underestimating the expected reverberant energy level.

BRIEF SUMMARY

As described in greater detail below, the reverberant dynamic response associated with a bounded wavefield environment is characterized and a corresponding maximum expected energy level associated with the reverberant response is calculated in a more complete and comprehensive manner. Statistical variances associated with the uncertainty in the excitation energy to which the bounded wavefield environment is exposed, as well as uncertainty in the damping and dispersion losses from the wavefield, and uncertainty in the modal parameters of bounded wavefield are each determined and combined in a consistent manner to determine a cumulative variance associated with the reverberant response. Using the cumulative variance associated with the reverberant response and a statistical mean for the reverberant response, a maximum expected energy level is determined with a desired level of confidence or reliability for a particular probability density function. The cumulative variance, the maximum expected energy level, and their relationship with respect to the excitation frequency may be output or otherwise displayed to a user via a display device or another suitable output device, thereby aiding the user in subsequently designing and testing a particular component for the likely real-world operating environment.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 9 depicts a graphical representation of an ensemble of energy simulations comparing a non-parametrically-determined mean response and modal variance with a parametrically-determined mean response and modal variance;

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration," and any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate generally to determining the expected reverberant energy level in a reverberant wavefield system in response to an excitation of the system. While the subject matter may be variously described herein in the context of an electromagnetics application or a vibro-acoustics application, the subject matter is not necessary limited to any particular type of excitation and/or operating environment, and the subject matter described herein may be implemented in an equivalent manner to determine the reverberant energy level for any particular reverberant wavefield system in response to any particular type of excitation.

Figure 1:
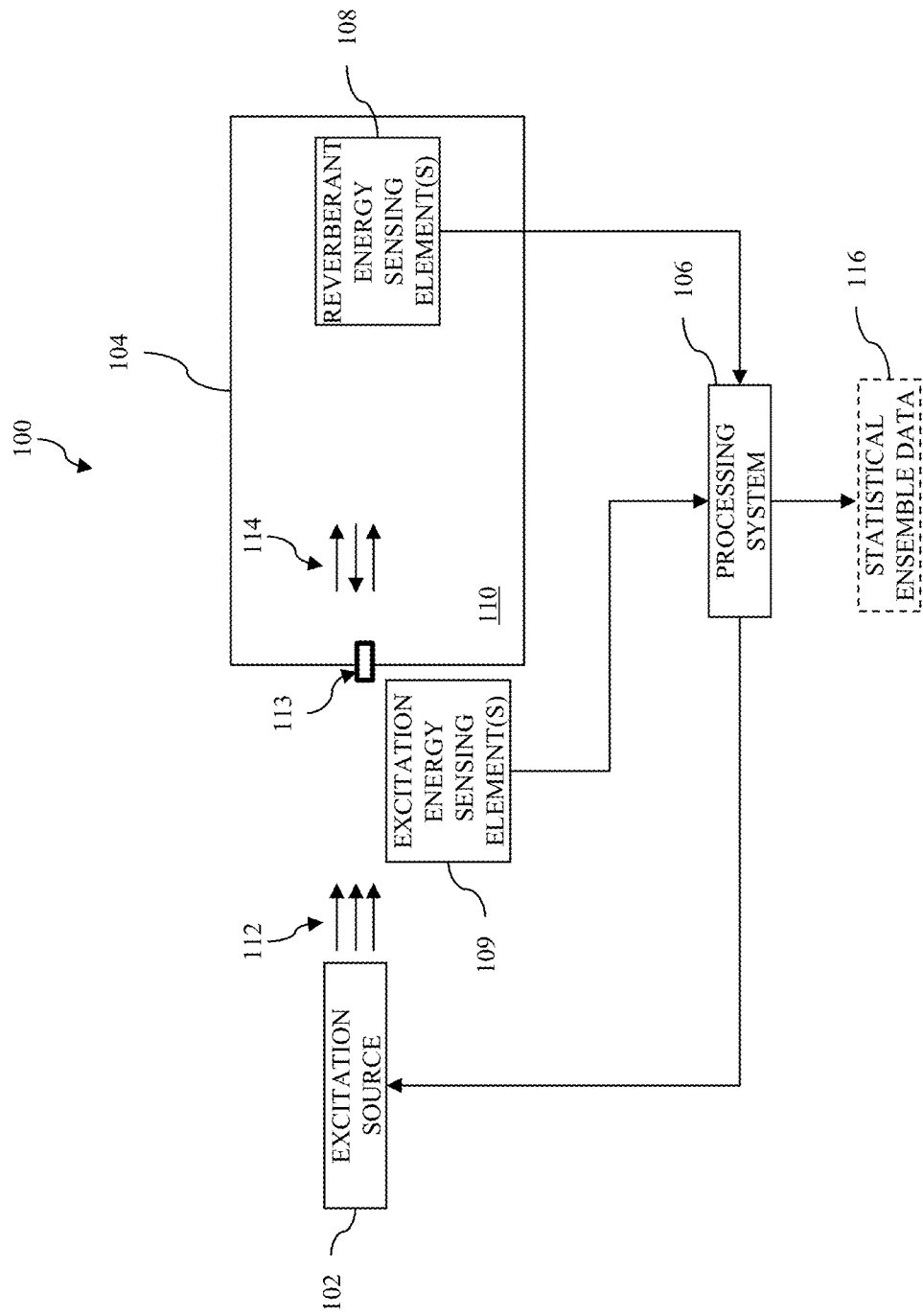
FIG. 1 is a block diagram of an exemplary reverberant system for characterizing the response of a reverberant subsystem in accordance with one or more embodiments.

FIG. 1 depicts a simplified representation of a system 100 for characterizing the response of a reverberant subsystem 104 with respect to excitation energy 112 from one or more excitation sources 102, which may be either external to or internal to the reverberant subsystem 104. In this regard, while FIG. 1 depicts a single excitation source 102 external to the reverberant subsystem 104, the subject matter described herein is not intended to be limited to the system 100 of FIG. 1, and practical embodiments may include any number of excitation sources which are external to and/or internal to the reverberant subsystem 104.

The reverberant subsystem 104 exhibits or otherwise supports a bounded wavefield having a complex multimodal dynamic response to the excitation energy 112 from the excitation source(s) 102, such that the excitation energy 112 is capable of inducing, generating or otherwise producing a reverberant wavefield 114 within the reverberant subsystem 104 in response to exposure to the excitation energy 112 from the excitation source(s) 102. In this regard, the reverberant subsystem 104 generally represents any component, element, or structure that provides wave reflecting boundaries for a generally uniform wave propagation medium 110 (e.g., air with bounded by a physical structure), where the wave reflecting boundaries substantially enclose the wavefield 114 propagating within the medium 110 in three dimensions such that the dynamic response to the excitation energy 112 at any point within the medium 110 and/or the reverberant subsystem 104 can be described by the reverberant response of highly reflected and scattered waves. It should be noted that in practice, the reverberant subsystem 104 and/or medium 110 may not be completely enclosed and the reflecting boundaries may include one or more apertures or openings 113 that allow external excitation energy 112 to enter the medium 110, while the medium 110 is otherwise enclosed or bounded by the remaining portions of the reverberant subsystem 104 surrounding the aperture(s) or opening(s) to maintain reverberant characteristics of the reverberant subsystem 104. Moreover, in some embodiments, a portion of the excitation energy 112 may propagate through the medium 110 and/or to other reverberant subsystems, as described in greater detail below in the context of FIGS. 11-15.

It should be appreciated that the reverberant subsystem 104 is not necessary limited to any particular type of wave reflecting, bounding structure, and the type and/or structure of the reverberant subsystem 104 may vary depending on the particular application and the type of excitation energy being analyzed. For example, in some embodiments, the reverberant subsystem 104 may be realized as a housing, container, or the like that is composed of materials that are responsive to the excitation energy from the excitation source 102 with dimensions relative to the wavelength of the excitation energy that result in a reverberant wavefield within the medium 110. In other embodiments, the reverberant subsystem 104 may be realized as an integrated circuit or another encapsulated electronic device or system, a wire, a cable, a conductive trace, a transmission line or any other conductive element. For example, in one embodiment, the excitation source 102 may be realized as an electromagnetic radiation source capable of inducing a reverberant electromagnetic field 114 within an electronics housing, an integrated circuit, a wire, or the like. In yet other embodiments, the reverberant subsystem 104 may be realized as a panel, an airfoil, or other component of a vehicle. For example, in one embodiment, the excitation source 102 may be realized as an source of vibro-acoustic waves (or mechanical waves) capable of producing a reverberant vibro-acoustic wavefield 114 within the reverberant subsystem 104. As described above, the reverberant subsystem 104 and/or medium 110 is influenced by or otherwise responsive to the excitation energy 112 that is emitted, generated, or otherwise produced by the excitation source 102, which, in turns, results in a reverberant wavefield 114 within the reverberant subsystem 104 and/or medium 110. In this regard, the energy level associated with reverberant wavefield 114 varies depending on the frequency of the excitation energy 112, the randomness and related uncertainties of the excitation energy 112 (and/or the frequency thereof), along with the uncertainty in the as-built modal power acceptance properties of the subsystem 104 and the uncertainty in the as-built modal loss factors of the subsystem 104.

To facilitate characterizing the reverberant response of the reverberant subsystem 104 as described in greater detail below in the context of FIGS. 3-4, in some embodiments, one or more sensing elements 108 are positioned on or within the reverberant subsystem 104 to detect, measure, sense, or otherwise quantify the energy level (or a characteristic indicative thereof) associated with reverberant wavefield 114 within the medium 110 in response to the input excitation energy 112 provided by the excitation source 102. For example, when the excitation source 102 is realized as an electromagnetic radiation source (e.g., a cellular device, a wireless device, a Bluetooth device, or other radio frequency (RF) transmitting device), the sensing element 108 may be configured to sense the electric field, voltage, current, or the like resulting from the electromagnetic radiation emitted by the electromagnetic radiation source 102. In such embodiments, the electromagnetic wavefield (or waves) 112 emitted by the electromagnetic radiation source 102 induces or otherwise produces a corresponding reverberant electromagnetic wavefield 114 within the medium 110 defined by the reverberant subsystem 104 that is measured or otherwise sensed by the sensing element 108. In another embodiment, when the excitation source 102 is realized as a vibro-acoustic source (e.g., a propulsion system), the sensing element 108 may be configured to sense the reverberant vibrational energy resulting from the excitation by the vibro-acoustic source 102. In such embodiments, the vibro-acoustic (or mechanical) wavefield (or waves) 112 emitted by the excitation source 102 induces or otherwise produces a corresponding reverberant vibro-acoustic wavefield 114 within the medium 110 defined by the reverberant subsystem 104 that is measured or otherwise sensed by the sensing element 108. Additionally, in some embodiments, one or more sensing elements 109 may be positioned at or near the surface of the reverberant subsystem 104 to detect, measure, sense, or otherwise quantify the energy level (or a characteristic indicative thereof) associated with the input excitation energy 112 provided by the excitation source 102 (e.g., for determining the mean or variance of the excitation energy 112, as described in greater detail below).

In the illustrated embodiment of FIG. 1, a data processing system 106 is communicatively coupled to the sensing elements 108, 109 and configured to receive measurement data from the sensing elements 108, 109 corresponding to the input excitation energy 112 and the reverberant energy 114 responsive to the excitation energy 112, analyze or otherwise process the measurement data to determine statistical ensemble data 116 representative of the input excitation energy 112 and the reverberant energy 114, and perform one or more additional processes, tasks, operations and/or functions described herein. The data processing system 106 may be realized as a computer or similar computing device or system, such as, for example, a conventional personal computer, a portable computer, a tablet computer, workstation and/or other computing system, or the like. In some embodiments, to facilitate characterizing the reverberant response of the reverberant subsystem 104, the data processing system 106 may be communicatively coupled to the excitation source 102 (or a control system associated with the excitation source 102) and configured to signal, command, instruct, or otherwise operate the excitation source 102 to provide reference excitation energy 112 having particular characteristics, as described in greater detail below in the context of FIGS. 3-4. However, it will be appreciated that after the reverberant subsystem 104 has been characterized, the data processing system 106 may be decoupled from the excitation source 102 during actual operation of the excitation source 102 and/or the reverberant subsystem 104, and moreover, the sensing elements 108, 109 may be removed from the reverberant subsystem 104. In other words, actual operation of the excitation source 102 and/or the reverberant subsystem 104 may be entirely independent of the data processing system 106 and/or the sensing elements 108, 109.

Figure 2:
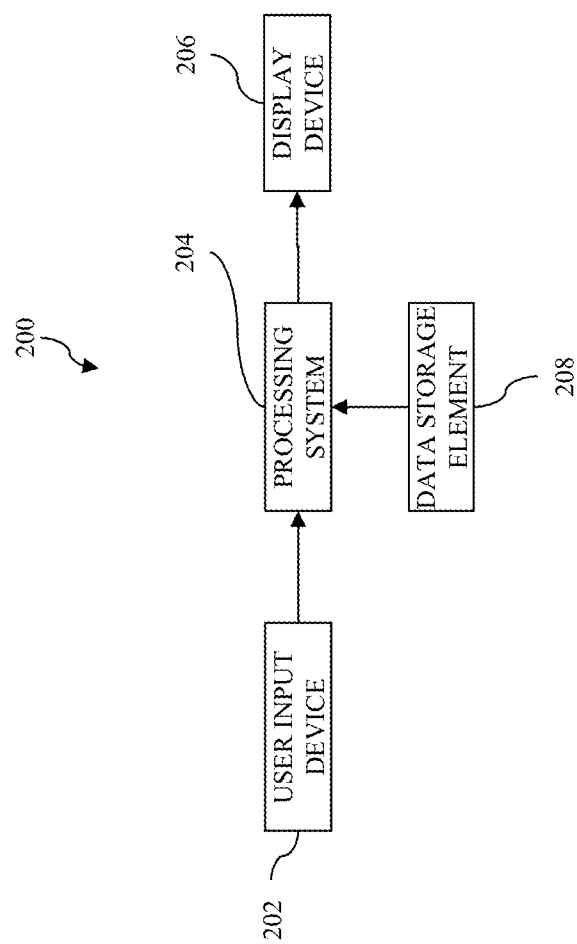
FIG. 2 is a block diagram of an exemplary computing system suitable for use with the system of FIG. 1.

FIG. 2 depicts an exemplary embodiment of a computing system 200 suitable for use in the system 100 of FIG. 1 (e.g., as data processing system 106 or a component thereof, or vice versa). In this regard, the computing system 200 is capable of executing the processes, tasks, and functions described in greater detail below in the context of FIGS. 3-4. The illustrated computing system 200 includes, without limitation, a user input device 202, a processing system 204, an output device 206, and a data storage element 208. It should be understood that FIG. 2 is a simplified representation of a computing system for purposes of explanation and is not intended to limit the scope of the subject matter in any way.

The user input device 202 generally represents the hardware and/or other components configured to provide a user interface with the computing system 200. Depending on the embodiment, the user input device 202 may be realize as a key pad, a keyboard, one or more button(s), a touch panel, a touchscreen, an audio input device (e.g., a microphone), or the like. The output device 206 generally represents the hardware and/or other components configured to provide output to the user from the computing system 200, as described in greater detail below. In an exemplary embodiment, the output device 206 is realized as an electronic display device configured to graphically display information and/or content under control of the processing system 204, as described in greater detail below.

Still referring to FIG. 2, the processing system 204 generally represents the hardware, circuitry, processing logic, and/or other components of the computing system 200 coupled to the user input device 202 and the display device 206 to receive input from the user, utilize the input provided by the user to execute various functions and/or processing tasks, and provide an output to the user, as described in greater detail below. Depending on the embodiment, the processing system 204 may be implemented or realized with a computer, a general purpose processor, a microprocessor, a controller, a microcontroller, a state machine, a content addressable memory, an application specific integrated circuit, a field programmable gate array, any suitable programmable logic device, discrete gate or transistor logic, discrete hardware components, or any combination thereof, designed to perform the functions described herein. Furthermore, the steps of a method or algorithm described in connection with the embodiments disclosed herein may be embodied directly in hardware, in firmware, in a software module executed by processing system 204, or in any practical combination thereof. The data storage element 208 may be realized as any non-transitory short or long term storage media capable of storing programming instructions or other data for execution by the processing system 204, including any sort of random access memory (RAM), read only memory (ROM), flash memory, registers, hard disks, removable disks, magnetic or optical mass storage, and/or any other suitable computer-readable medium. The computer-executable programming instructions, when read and executed by the processing system 204, cause the processing system 204 to execute one or more processes and perform the tasks, operations, and/or functions described in greater detail below in the context of FIGS. 3-4.

Referring now to FIGS. 1-2, in an exemplary embodiment, the processing system 204 executes the programming instructions stored or otherwise encoded on the data storage element 208, which causes the processing system 204 to display one or more graphical user interface elements (e.g., text boxes or the like) on the display device 206 that are adapted to receive user inputs indicative of the physical dimensions and/or physical layout of the reverberant subsystem 104 along with the mechanical, electrical, chemical, material and/or other physical properties of the reverberant subsystem 104 and/or the medium 110 (e.g., the permeability, the permittivity, the conductivity, and/or the like) that influence the reverberant response to the excitation energy 112. Additionally, the processing system 204 may also display graphical user interface elements on the display device 206 that are adapted to receive user inputs indicative of the magnitude, frequency, and/or other characteristics of the excitation energy 112 to be provided by the excitation source 102 to be used for purposes of obtaining corresponding measurement data for characterizing the reverberant response of the reverberant subsystem 104 and/or the medium 110, as described in greater detail below.

After providing the desired input information, the user may manipulate the user input device 202 to select a graphical user interface element (e.g., a button or the like) that causes the processing system 204 to continue executing the programming instructions using the inputs received from the user. As described in greater detail below, the processing system 204 may command, signal, control or otherwise operate the excitation source 102 to provide excitation energy 112 with the desired characteristics, receive the corresponding measurement data from the sensing elements 108, 109 and calculate or otherwise determine corresponding statistical ensemble data (e.g., statistical ensemble data 116) which may be stored by the data storage element 208. In other embodiments, the processing system 204 may receive or otherwise obtain the statistical ensemble data 116 from the data processing system 106 of FIG. 1. Based at least in part on the measurement data and/or the statistical ensemble data, the processing system 204 calculates or otherwise determines a value, metric, or equation for the variance associated with the reverberant response of the reverberant subsystem 104 as described in greater detail below in the context of the reverberant variance determination process 300 of FIG. 3. Thereafter, the processing system 204 may utilize the total variance to calculate or otherwise determine a maximum expected reverberant response for the reverberant subsystem 104 and generate or otherwise provide one or more output indications indicative of the maximum expected reverberant response on the display device 206, as described in greater detail below in the context of the maximum expected response determination process 400 of FIG. 4.

Figure 3:
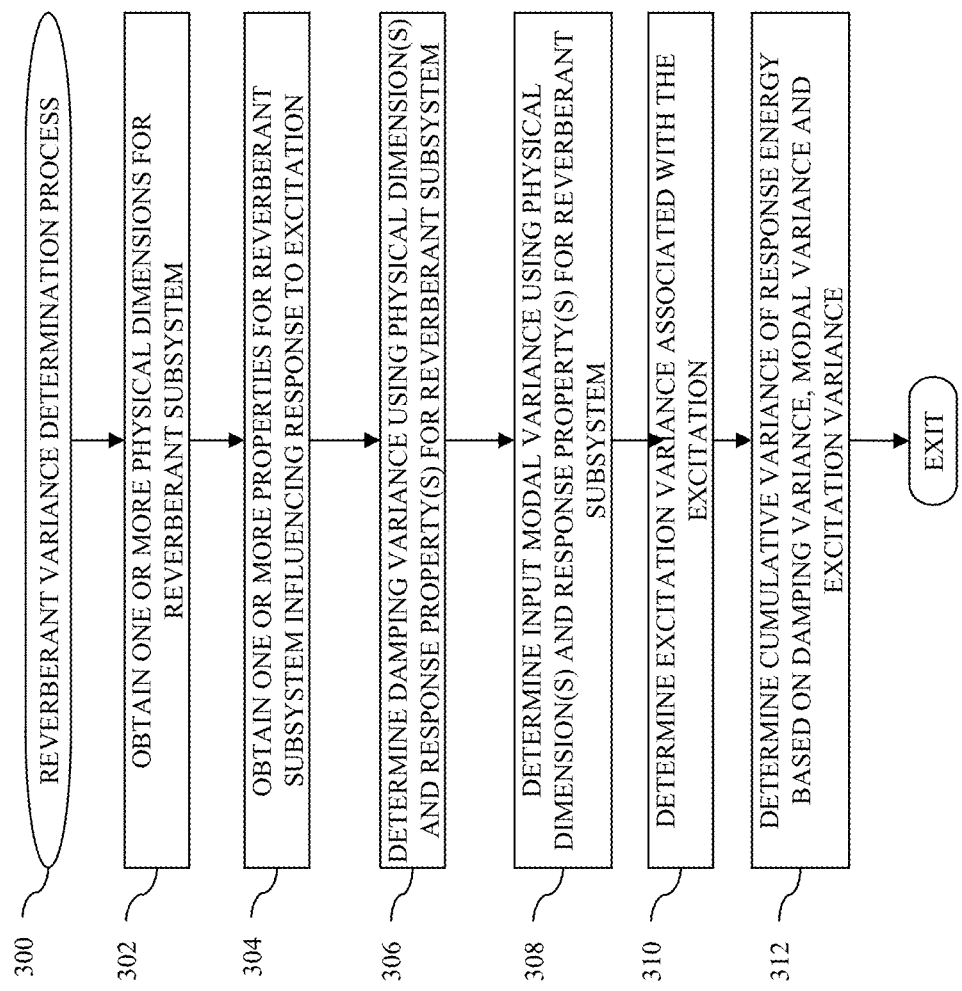
FIG. 3 is a flow diagram that illustrates an exemplary reverberant variance determination process suitable for use with the system of FIG. 1 and/or the computing system of FIG. 2.

FIG. 3 depicts an exemplary embodiment of a reverberant variance determination process 300 that may be implemented or otherwise performed by the processing system 106 in FIG. 1 and/or the computing system 200 of FIG. 2. The various tasks performed in connection with the illustrated process 300 may be implemented using hardware, firmware, software executed by processing circuitry, or any combination thereof. For illustrative purposes, the following description may refer to elements mentioned above in connection with FIG. 1 or FIG. 2. It should be appreciated that the reverberant variance determination process 300 may include any number of additional or alternative tasks, the tasks need not be performed in the illustrated order and/or the tasks may be performed concurrently, and/or the reverberant variance determination process 300 may be incorporated into a more comprehensive procedure or process having additional functionality not described in detail herein. Moreover, one or more of the tasks shown and described in the context of FIG. 3 could be omitted from a practical embodiment of the reverberant variance determination process 300 as long as the intended overall functionality remains intact.

In exemplary embodiments, the reverberant variance determination process 300 begins by obtaining or otherwise identifying one or more physical dimensions for the reverberant subsystem being analyzed (task 302). In this regard, the processing system 106, 204 obtains (e.g., from a user via the user input device 202) one or more of the length, width, height, surface area, volume and/or other dimensional metrics that quantify or otherwise describe the physical shape of the reverberant subsystem 104. The processing system 204 may store or otherwise maintain the physical dimension(s) and statistical ensemble data 116 for the reverberant subsystem 104 in the data storage element 208 for subsequent reference. The reverberant variance determination process 300 also obtains or otherwise identifies one or more physical properties for the reverberant subsystem that influence its reverberant response to excitation energy (task 304). In a similar manner, the processing system 106, 204 obtains (e.g., from a user via the user input device 202) the mechanical, electrical, chemical, material and/or other physical properties of the reverberant subsystem 104 and/or the medium 110 (e.g., the permeability, the permittivity, the conductivity, and/or the like) and/or statistical ensemble data 116 that quantify or otherwise describe the physical response of the reverberant subsystem 104 and/or medium 110 to the input excitation energy 112 and/or the resulting reverberant energy 114. The processing system 204 may also store or otherwise maintain the properties of the reverberant subsystem 104 and/or the medium 110 in the data storage element 208 for subsequent reference.

After obtaining the physical dimensions and response properties for the reverberant subsystem, the reverberant variance determination process 300 calculates or otherwise determines a variance associated with the effective loss factor (e.g., the damping or quality factor) of the reverberant subsystem (task 306). In this regard, the variance associated with the response loss factor represents the uncertainty in the effective damping (or quality factor) associated with the reverberant subsystem 104 and/or the medium 110, which, in practice, may vary with respect to frequency. For purposes of explanation, the variance for the effective loss factor (or damping or qualify factor) associated with the reverberant subsystem 104 and/or the medium 110 may alternatively be referred to herein as the damping variance.

In one or more embodiments, the damping variance is empirically determined by the processing system 106, 204 operating the excitation source 102 to provide one or more different controlled reference excitation energies 112, which produces corresponding reverberant response energies 114 that are measured or otherwise sensed by the sensing element(s) 108 coupled to or otherwise positioned within the reverberant subsystem 104. Parametric tests which vary the amount of damping applied or the type of energy loss may be performed by using the Monte Carlo method or another similar technique to determine a sequence of different reference excitations to be utilized for purposes of determining the damping variance. In this regard, the processing system 106, 204 may vary characteristics of the reference excitation energy 112, vary the location where the reference excitation energy 112 is input, and/or vary the amplitude of the reference excitation energy 112 in a manner that is representative of the uncertainty in the excitation energy input to the reverberant subsystem 104 in the real-world operating environment. The processing system 106, 204 receives or otherwise obtains the measurement data from the sensing element(s) 108 that correspond to the reverberant energies 114 in response to the reference excitation energies 112. The processing system 106, 204 may then process or otherwise analyze the measurement data corresponding to the reverberant response energies 114 and similarly, the reference excitation energies 112 to determine a statistical ensemble of damping estimates. Thereafter, the processing system 106, 204 calculates or otherwise determines the mean damping (or quality factor) and the variance associated therewith based at least in part on the relationship between the reference excitation energies 112 and the corresponding measurement data for the reverberant response energies 114 (e.g., using the statistical ensemble data 116).

In alternative embodiments, the damping variance is calculated or otherwise determined by the processing system 106, 204 by simulating the reverberant response of the reverberant subsystem 104 and/or medium 110 to reference excitation energy using one or more of the physical dimensions and/or response properties associated with the reverberant subsystem 104 and/or medium 110. For example, the processing system 106, 204 may generate or otherwise create an electromagnetic model of the bounding structure (e.g., the wall(s) or other physical boundaries) of the reverberant subsystem 104 and/or the medium 110 using the physical dimensions associated with the reverberant subsystem 104 (e.g., surface area, volume, and/or the like) along with the electromagnetic properties associated with the reverberant subsystem 104 and/or medium 110 (e.g., permeability, permeability, conductivity, and/or the like). After creating the electromagnetic model, the processing system 106, 204 may perform a Monte Carlo simulation by varying the electromagnetic radiation (e.g., magnitude and/or frequency) that may be emitted or otherwise produced by the excitation source 102 in a manner that is representative of the uncertainty in the input excitation energy the reverberant subsystem 104 in the real-world operating environment and/or varying the physical dimensions and/or electromagnetic response properties of the electromagnetic model in a manner that is representative of the uncertainty with respect to the reverberant subsystem 104. Thus, the electromagnetic model of the reverberant subsystem 104 and/or medium 110 may be used to simulate or otherwise estimate the reverberant electromagnetic energy levels 114 in response to the various electromagnetic radiation energies that may be emitted by the excitation source 102 during operation and/or the possible variations in the physical dimensions and/or properties of the reverberant subsystem 104 during real-world operation. In a similar manner as described above, using the relationships between simulated response measurement data and the corresponding simulated excitation energies, the processing system 106, 204 calculates or otherwise determines the statistical mean of the simulated damping (or quality factor) and the variance associated therewith.

Still referring to FIG. 3, the reverberant variance determination process 300 also calculates or otherwise determines a variance associated with the modal power acceptance (e.g., the modal input mobility or modal input impedance) of the reverberant subsystem using one or more of the physical dimensions and/or response properties (task 308). In this regard, the variance associated with the modal power acceptance represents the uncertainty in the input impedance or input mobility associated with the reverberant subsystem 104 and/or the medium 110, which, in practice, may also vary with respect to frequency. For purposes of explanation, the variance associated with the modal input power acceptance, the modal input mobility, the modal input impedance, and/or variants thereof may alternatively be referred to herein as the input modal variance. As described in greater detail below, the input modal variance for the reverberant field response can be found by applying a universal statistical result relating to the occurrence of the Gaussian Orthogonal Ensemble (GOE) in random matrix theory. At high statistical overlap, the statistics of the natural frequencies and mode shapes of the reverberant subsystem 104 and/or medium 110 is governed by the GOE, and it is possible to predict the variance of the input modal response without knowing the precise details of the random variations in the physical dimensions and/or properties of the reverberant subsystem 104. In this regard, the input modal variance may be determined using a non-parametric equation or formula. In other embodiments, the input modal variance may be determined by parametric tests or parametric simulations in a similar manner as described above in the context of the damping variance (e.g., using the relationships between the statistical ensemble data for reverberant responses and their corresponding reference excitation energies).

Additionally, the reverberant variance determination process 300 also calculates or otherwise determines a variance associated with the excitation energy (task 310). The variance associated with the excitation energy represents the uncertainty in the level or mean-squared amplitude of the excitation source 102 (or alternatively, the input to the reverberant subsystem 104 and/or medium 110) at any given frequency of in any given frequency band. For purposes of explanation, the variance associated with the root mean square excitation energy level, the excitation energy spectrum, the excitation power spectral density, and/or variants thereof may alternatively be referred to herein as the excitation variance. In some embodiments where the excitation source 102 and/or the excitation energy 112 are precisely controlled, such as in the parametric experiments described above in the context of the damping variance and/or the input modal variance, the excitation variance may be equal to zero. In other embodiments, the excitation variance may be empirically determined based on measurement data. For example, the sensing element(s) 109 may be positioned on or at the exterior surface of the reverberant subsystem 104 to measure, sense, or otherwise detect the ambient excitation energy that is interfacing with the reverberant subsystem 104 at or near the location where the excitation energy is input to the reverberant subsystem 104 (e.g., at or near opening 113). Alternatively, the processing system 106, 204 may operate the excitation source 102 to output reference excitation energy 112, which is measured by one or more of the sensing elements 109 positioned on or at the exterior surface of the reverberant subsystem 104, an varying one or more aspects of the reference excitation energy 112 in a manner that is representative of the uncertainty in the input excitation energy the reverberant subsystem 104 in the real-world operating environment. The corresponding measurement data output by the sensing element(s) 109 corresponding to the variations in the reference excitation energy 112 is analyzed by the processing system 106, 204 to determine the statistical mean and variance of the excitation energy 112 (e.g., the statistical ensemble data 116 associated with the excitation source 102) input to the reverberant subsystem 104 during operation of the excitation source 102. In yet other embodiments, the processing system 106, 204 may generate or otherwise create a model of the excitation source 102 and its physical relationship with respect to (or positioning relative to) the reverberant subsystem 104, then perform a Monte Carlo simulation (or other parametric simulation) to simulate or otherwise estimate the varying excitation energies 112 that may be input to the reverberant subsystem 104 in the real-world operating environment, then calculate or otherwise determine the corresponding mean and variance associated with the excitation energy 112 based on the simulation data.

After determining the damping variance, the input modal variance, and the excitation variance, the reverberant variance determination process 300 calculates or otherwise determines a cumulative variance associated with the reverberant response energy level based on the damping variance, the input modal variance, and the excitation variance (task 312). In this regard, as described below, when the damping variance, the input modal variance, and the excitation variance are statistically independent of each other, the total variance formula (or law of total variance) can be utilized to determine the cumulative variance based on the power balance relationship between the excitation energy and the reverberant response energy. For purposes of explanation, the subject matter will be described with reference to an exemplary embodiment in the field of electromagnetics, however, as noted above, the subject matter may be implemented in an equivalent manner in vibro-acoustics or other fields.

Cumulative Energy Variance Derivation

The response of a reverberant wavefield can be represented as the sum of the resonant responses of the modes or standing waves of the bounded wavefield. At frequencies where there is high modal density, the complex response at any frequency is reverberant and can be described by the total energy. For example, the total energy $U(\omega)$ of a vibro-acoustic wavefield at any given frequency $\omega$ (in rad/sec) is twice the space integral of the time-averaged kinetic energy. For a vibrating panel with uniform mass per unit area $\hat{m}$ and area A, the energy is $U(\omega)=\hat{m}A\langle|v(\omega)|^2\rangle_{sp}$ where $\langle|v(\omega)|^2\rangle_{sp}$ is the space-averaged means-squared vibration velocity level. As a second example, the energy in a reverberant electromagnetic cavity with volume V, permittivity $\varepsilon$ and permeability $\mu$ is $U(\omega)=\mu V\langle(|h(\omega)|^2\rangle_{sp}=\varepsilon V\langle|e(\omega)|^2\rangle_{sp}$ where $\langle|h(\omega)|^2\rangle_{sp}$ is the space-averaged means-squared magnetic field strength and $\langle|e(\omega)|^2\rangle_{sp}$ is the space-averaged means-squared electric field strength.

Figure 7:
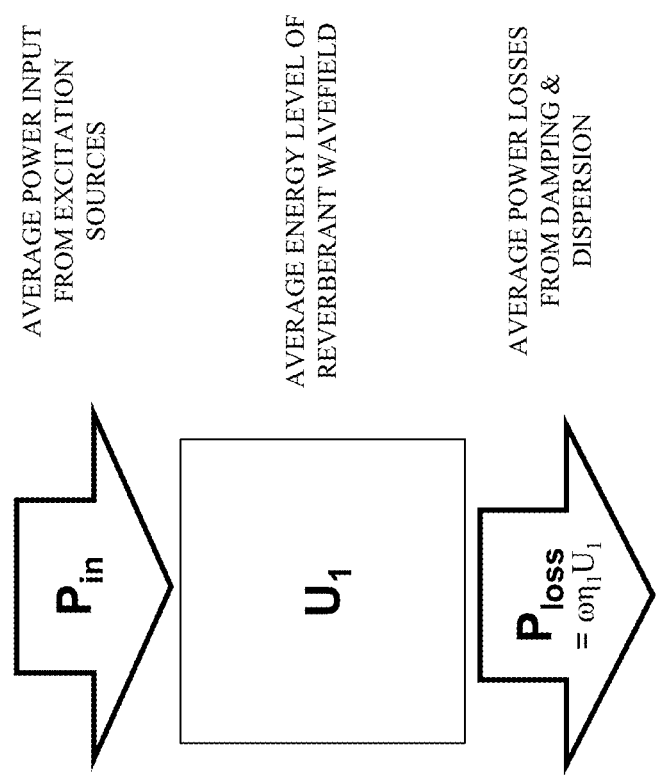
FIG. 7 depicts a graphical representation of the power balance for a reverberant subsystem.

In both vibro-acoustics and electromagnetics, the reverberant response energy $U(\omega)$ can be related to the excitation energy using the time-averaged power balance equation $P_{in}(\omega)=P_{diss}(\omega)$, where $P_{in}$ is the input power associated with the excitation energy and $P_{diss}$ is the power dissipated by reverberant subsystem 104 and/or the medium 110, as illustrated by FIG. 7. For a vibro-acoustic subsystem the total power input must be balanced by the total power losses due to modal damping and dispersion losses which are together quantified by an effective damping loss factor $\eta(\omega)$ such that $P_{diss}(\omega)=\omega\eta(\omega)U(\omega)$. The corresponding power dissipated in a electromagnetically reverberant subsystem 104 and/or medium 110 may be governed by the equation $P_{diss}(\omega)=\omega\eta(\omega)U(\omega)\equiv\omega U(\omega)/Q(\omega)$, where Q is the quality factor (Q-factor) describing the electromagnetic damping of the reverberant subsystem 104 and/or medium 110. The quality factor may be determined using the equation $$Q = \frac{3V}{2\mu_r\delta S},$$

where V is the volume of the reverberant medium 110, S is the surface area of the bounding structure of the reverberant subsystem 104, $\mu_r$ is the relative permeability of the medium 110. $\delta$ is governed by the equation $\delta=2/\sqrt{\omega\mu_w\sigma_w}$, where $\mu_w$ is the permittivity of the bounding surface area S, and $\sigma_w$ is the conductivity of the bounding surface area S.

For any reverberant wavefield—including the vibro-acoustic and electromagnetic wavefields described above—it is possible to predict the response energy level from a knowledge of only the power input and the total effective loss factor. However, there is often uncertainty in theses quantities especially early in a product development cycle when exact design details are not defined and a prototypes are not available for testing. It is therefore necessary to conduct an uncertainty analysis that statistically defines the maximum expected response energy for an estimated uncertainty in the power input $P_{in}(\omega)$ and an estimated uncertainty in the as-built damping loss factor $\eta(\omega)$ or Q factor $Q(\omega)$.

The power input is a function of both the excitation energy level and input modal acceptance of the reverberant wavefield subsystem, and in the most general case there is uncertainty in both excitation energy level and input modal acceptance. For a reverberant electromagnetic wavefield, the ensemble average power input $P_{in}$ can be represented as an enforced magnetic field $h_s(\omega)$ over a small, localized domain of the surface or volume of the reverberant subsystem 104 and/or medium 110. The ensemble average E[ ] of the power input by the excitation source 102 and/or excitation energy 112 may be governed by the equation $E[P_{in}(\omega)]=\omega E[|h_s(\omega)|^2]E[Re\{Z_D(\omega,Q)\}]$, where $Z_D$ represents the modal input impedance of the reverberant subsystem 104 and/or medium 110 (alternatively, the cavity "direct field" impedance or the impedance radiating into an infinite free space). In the most general case, the source current spectrum $|h_s(\omega)|^2$ is uncertain and the Q factor is uncertain such that the variability in each needs to treated separately in estimating maximum expected response.

Using the power balance equation to combine the ensemble average of the power dissipated and the ensemble average of the power input in terms of the expected value of the mean squared excitation energy spectrum $h_s^*h_s$, the expected value of the Q factor and the expected value of power input results in the equation $\omega E[U(\omega)]=E[|h_s(\omega)|^2]E[Q(\omega)Re\{Z_D(\omega,Q)\}]$. In reverberant wavefields, the frequency band-integrated power input may be assumed to be independent of the modal damping, provided the integration bandwidth $\Delta\omega$ is greater than the modal half-power bandwidth. Additionally, the source current spectrum $|h_s(\omega)|^2$ and the Q factor can each be considered approximately constant within the frequency band, resulting in the equation $\omega E[U_{\Delta\omega}]=E[|h_{s,\Delta\omega}|^2]E[\overline{Q}]E[Re\{\overline{Z_D}\}]$, where the subscript $\Delta\omega$ denotes a frequency band integral and the overbar denotes frequency band average.

Applying power balance relationship to a single instance of a reverberant subsystem 104 and/or medium 110 excited by localized excitation source 102, the expectation operator can be removed, resulting in the equation $\omega U_{\Delta\omega}=|h_{s,\Delta\omega}|^2 \overline{Q}\text{Re}\{Z_D\}$. Thus, when the excitation, the Q factor (or damping), and the modal response are statistically independent of each other, the total variance formula can be utilized to determine the cumulative variance for the reverberant energy (Var[U]), represented by the following equation:

$$\text{Var}[U] = \text{Var}[h_s^2]\text{Var}[Q]\text{Var}[Z_D] + \langle h_s^2\rangle^2\langle Q\rangle^2\text{Var}[Z_D] +$$
$$\langle h_s^2\rangle^2\langle Z_D\rangle^2\text{Var}[Q] + \langle Q\rangle^2\langle Z_D\rangle^2\text{Var}[h_s^2] + \langle h_s^2\rangle^2\text{Var}[Q]\text{Var}[Z_D] +$$
$$\langle Q\rangle^2\text{Var}[h_s^2]\text{Var}[Z_D] + \langle Z_D\rangle^2\text{Var}[h_s^2]\text{Var}[Q]$$

In many practical applications, the ensemble mean $\langle Q \rangle$ and ensemble variance Var[Q] of the Q factor (or damping) can be measured or determined as a function of frequency, as described above (e.g., task 306). Additionally, the excitation energy 112 spectrum $|h_s(\omega)|^2$ may be either a controlled input quantity where the statistical mean and variance are known (Var$[h_s^2]\to 0$), or alternatively, the mean and variance of the excitation energy 112 may be determined based on measurement data obtained from one or more sensing elements 108 on or at the surface of the reverberant subsystem 104, as described above (e.g., task 310).

As described above (e.g., task 308), the statistical variance of the input impedance $Z_D(\omega)$ will be a function of the modal overlap and statistical overlap of the modes of the reverberant subsystem 104, which can be determined using a non-parametric modal variance formulation. Alternatively, the variance in input impedance can also be found by a series of Monte Carlo experiments, either by testing or numerical simulation of a representative reverberant wavefield subsystem.

The equation for the cumulative variance of the reverberant energy (Var[U]), can be rewritten in terms) of relative variances, as $r^2[U]=r^2[h_s^2]+r^2[Q]+r^2[Z_D]+r^2[h_s^2]r^2[Q]+r^2[Q]r^2[Z_D]+r^2[h_s^2]r^2[Z_D]+r^2[h_s^2]r^2[Q]r^2[Z_D]$. In embodiments where the relative variance for some or all of the uncertain parameters is less than unity $r^2[X_i]<1$, the double and triple product of relative variances may be negligibly small, in which case the cumulative relative variance of the reverberant response reduces to $r^2[U]=r^2[h_s^2]+r^2[Q]+r^2[Z_D]$.

As a further example, consider the random vibration response of a launch vehicle structural panel excited by unsteady aerodynamic excitation. The aerodynamic excitation needs to be described by a force cross spectral density $S_{ff}(\underline{x}, \underline{x}', \omega)$ acting over the whole surface of the panel. For uncertainty analysis it is convenient to represent the general cross spectrum excitation in a separable form $S_{ff}(\underline{x}, \underline{x}', \omega)\cong \overline{S}_{ff}(\omega)\cdot\gamma^2(\underline{x}, \underline{x}', \omega)$ where $\overline{S}_{ff}(\omega)$ is the space-averaged force auto spectral density—a function of frequency only—and $\gamma^2(\underline{x}, \underline{x}', \omega)=S_{ff}(\underline{x}, \underline{x}', \omega)/\overline{S}_{ff}(\omega)$ is the spatial correlation of the excitation. The spectral density of the input power to the reverberant vibration wavefield can then be reduced to $P_{in}(\omega)=\overline{S}_{ff}(\omega)J^2(\omega)\text{Re}[Y(\omega)]$ where $J^2(\omega)$ is the average modal joint acceptance and Re[Y($\omega$)] is the real part of the modal input mobility of the panel. The dimensionless modal joint acceptance $$J_r^2(\omega) = [1/A^2]\int_A\int \psi_r(\underline{x})\gamma^2(\underline{x}, \underline{x}', \omega)\psi_r(\underline{x}')d\underline{x}d\underline{x}'$$

describes the spatial correlation between the excitation $S_{ff}(\underline{x}, \underline{x}', \omega)$ and the r mode shapes $\psi_r(\underline{x})$ of the panel vibration wavefield. Since both the mobility $$Y(x, \omega) = \sum_r \frac{i\omega}{m_r[\omega_r^2(1+i\eta_r)-\omega^2]}$$

and the modal joint acceptance depend on the panel vibration mode shapes, they can be combined into a single input mobility $\overline{R}(\omega)=J^2(\omega)\text{Re}[Y(\omega)]$ simplifying the vibro-acoustic power input to $P_{in}(\omega)=\overline{S}_{ff}(\omega)\overline{R}(\omega)$.

In vibro-acoustics it is also more common to quantify the modal damping by the a factor $\eta(\omega)$ rather than a Q factor $Q(\omega)$. The energy level of panel reverberant vibration is defined by the power balance relationship $\omega U(\omega)=P_{in}(\omega)/\eta(\omega)=\overline{S}_{ff}(\omega)\overline{R}(\omega)/\eta(\omega)$. To estimate the energy variance Var (U), it is desirable to avoid dealing with the variance of a quotient of independent variables, by conducting a perturbation analysis on the product relationship $\omega\eta(\omega)U(\omega)=\overline{S}_{ff}(\omega)\overline{R}(\omega)$. Taking $\eta=\langle\eta\rangle+\eta'$, $S=\langle S\rangle+S'$ and $R=\langle R\rangle+R'$ and neglecting terms which are second order in the small perturbations $X_i'$ about the mean $\langle X_i\rangle$ yields $\omega\langle\eta\rangle(U-\langle U\rangle)\cong\langle S\rangle R'+S'\langle R\rangle-\langle U\rangle\omega\eta'$. The variance of the energy is Var(U)=E[(U-$\langle U\rangle)^2$] which can be obtained from the perturbation analysis assuming excitation, input mobility and damping are all statistically uncorrelated to yield $\omega^2\langle\eta\rangle^2$ Var(U)$\cong\langle S\rangle^2$Var(R)+$\langle R\rangle^2$Var(S)-$\langle U\rangle^2\omega^2$Var($\eta$). The corresponding relative variance is $r^2$(U)=Var(U)/$\langle U\rangle^2\cong r^2$(S)+$r^2$(R)+$r^2$($\eta$). The relative variance in input mobility $r^2(\overline{R})=r^2(\overline{J^2\text{Re}[M(\omega)]})$ can be estimated with non-parametric models for the asymptotic modal acceptance statistics. The relative variance of space-averaged excitation force autospectral density $r^2(\overline{S}_{ff})$ and the relative variance of the effective modal loss factor $r^2(\eta)$ can each be estimated by statistical processing of Monte Carlo experiments from physical testing or from Monte Carlo experiments on a numerical simulation of the system.

Maximum Expected Response Determination

Figure 4:
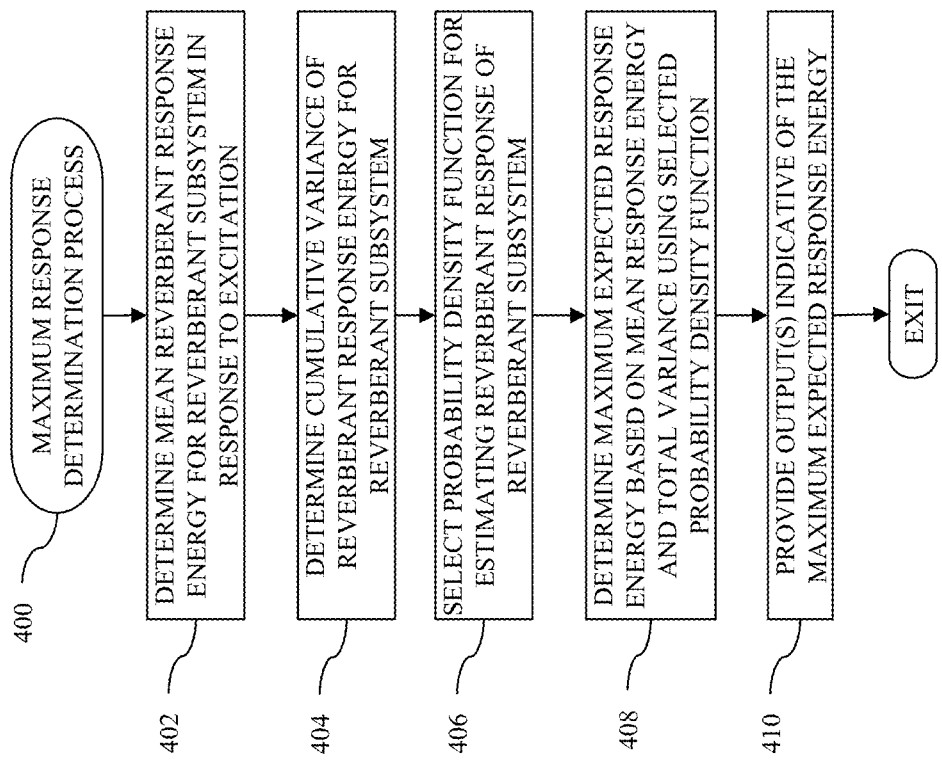
FIG. 4 is a flow diagram that illustrates an exemplary maximum expected response determination process suitable for use with the system of FIG. 1 and/or the computing system of FIG. 2 in conjunction with the reverberant variance determination process of FIG. 3.

FIG. 4 depicts an exemplary embodiment of a maximum response determination process 400 that may be implemented or otherwise performed by the processing system 106 in FIG. 1 and/or the computing system 200 of FIG. 2 in conjunction with the reverberant variance determination process 300 of FIG. 3. The various tasks performed in connection with the illustrated process 400 may be implemented using hardware, firmware, software executed by processing circuitry, or any combination thereof. For illustrative purposes, the following description may refer to elements mentioned above in connection with FIG. 1 or FIG. 2. It should be appreciated that the maximum response determination process 400 may include any number of additional or alternative tasks, the tasks need not be performed in the illustrated order and/or the tasks may be performed concurrently, and/or the maximum response determination process 400 may be incorporated into a more comprehensive procedure or process having additional functionality not described in detail herein. Moreover, one or more of the tasks shown and described in the context of FIG. 4 could be omitted from a practical embodiment of the maximum response determination process 400 as long as the intended overall functionality remains intact.

The maximum response determination process 400 begins by determining or otherwise obtaining the mean reverberant response energy level for the reverberant subsystem being analyzed in response to excitation energy from the excitation source (task 402). Depending on the embodiment, the mean reverberant response energy level for the reverberant subsystem 104 may be empirically determined by the processing system 106, 204 based on measurement data obtained from the sensing element(s) 108 during operation of the excitation source 102 or by simulating the reverberant response based on the physical dimensions and properties of the reverberant subsystem 104 in a power balance model like that shown in FIG. 7. The maximum response determination process 400 continues by calculating, determining or otherwise obtaining the variance associated with the reverberant response energy level for the reverberant subsystem being analyzed in response to excitation energy from the excitation source (task 404). In this regard, the processing system 106, 204 implements or otherwise performs the reverberant variance determination process 300 to determine the cumulative total variance associated with the reverberant response energy level (or alternatively, the cumulative relative variance associated with the reverberant response energy level).

In exemplary embodiments, the maximum response determination process 400 continues by identifying or otherwise selecting a probability density function for modeling the reverberant response energy level, calculating or otherwise determining a maximum expected reverberant response energy level based on the mean reverberant response energy level and the variance associated with the reverberant response energy level using the selected probability density function, and generating or otherwise providing an output indicative of the maximum expected reverberant response energy level (tasks 406, 408, 410). For example, the user may manipulate the user input device 202 to select or otherwise indicate a probability density function that the user would like to use to model the reverberant response. Additionally, the user may manipulate the user input device 202 to select or otherwise indicate the percentile (or confidence level) for which the user is interested in knowing the maximum expected reverberant response energy level (e.g., the $95^{th}$ percentile). In response to receiving indication of the selected probability density function and the desired percentile, the processing system 106, 204 calculates or otherwise determines the maximum expected reverberant response energy level for a particular frequency using the selected probability density function by inputting the desired percentile, the mean reverberant response energy level for that frequency, and the cumulative variance associated with the reverberant response energy level for that frequency. The maximum expected response energy level correlates to or otherwise represents the anticipated maximum signal level that would be detected, sensed, or otherwise measured within the substantially enclosed reverberant system (e.g., by a sensing element 108 within the reverberant subsystem 104 and/or medium 110).

In some embodiments, the processing system 106, 204 may step through a sequence or range of frequencies by sequentially determining the cumulative variance associated with the reverberant response energy level for that particular frequency of the sequence and inputting that cumulative variance to the selected probability density function along with the mean reverberant response energy level for that frequency and the desired percentile to obtain the maximum expected reverberant response energy level for that frequency. In this regard, for each particular frequency, the processing system 106, 204 may store or otherwise maintain (e.g., in data storage element 208) the maximum expected reverberant response energy level for that frequency in association with the cumulative variance and mean reverberant response energy level for that frequency.

In exemplary embodiments, after determining the maximum expected reverberant response energy level, the processing system 106, 204 generates or otherwise provides a graphical indication of the maximum expected reverberant response energy level on the display device 206. For example, for a particular frequency range, the processing system 106, 204 may generate or otherwise provide a graph or chart of the relationship between the maximum expected reverberant response energy level and the frequency. Furthermore, in some embodiments, the processing system 106, 204 may also generate or otherwise provide a graphical representation of the relationship of one or more of the cumulative variance, the excitation variance, the modal response variance, and/or the damping variance with respect to the frequency. In this manner, the user may view the display device 206 to ascertain the maximum expected reverberant response energy level for which the reverberant subsystem 104 and/or the medium 110 (or components thereof or components to be contained therein) should be designed to withstand (for the selected percentile or confidence level), along with the relationship between the frequency and the reverberant response of the reverberant subsystem 104 and/or the medium 110.

Figure 5:
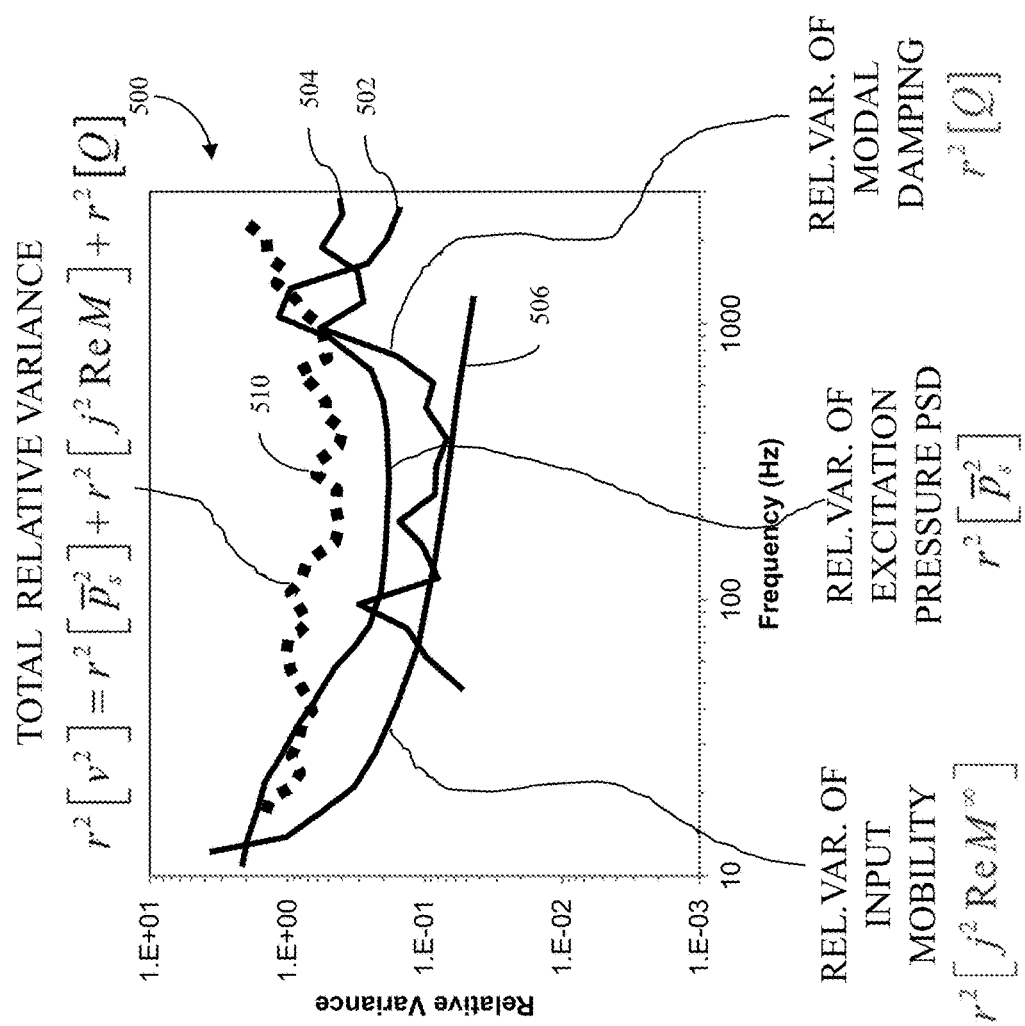
FIG. 5 depicts a display including graphical representations of component variances suitable for display on the display device in the computing system of FIG. 2 in conjunction with the reverberant variance determination process of FIG. 3.
Figure 6:
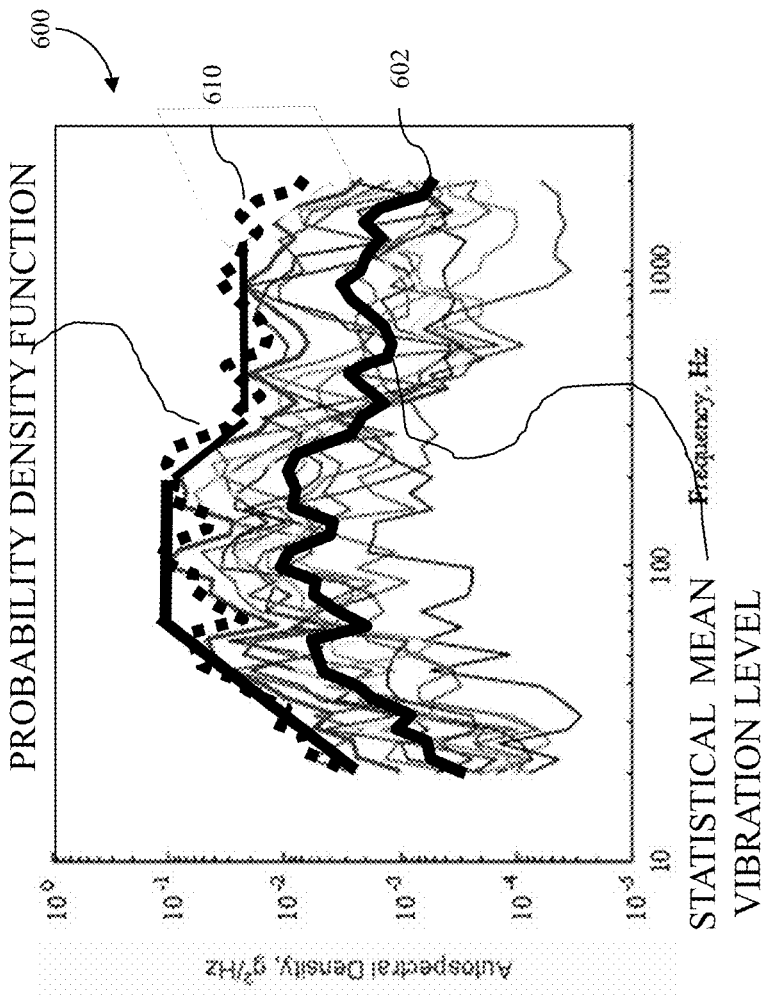
FIG. 6 depicts a display including graphical representation of a maximum expected response suitable for display on the display device in the computing system of FIG. 2 in conjunction with the maximum expected response determination process of FIG. 4.

FIGS. 5-6 depict exemplary displays that may be presented on the display device 206 in conjunction with the maximum response determination process 400 of FIG. 4 and/or the reverberant variance determination process 300 of FIG. 3. In this regard, the display 500 of FIG. 5 depicts a graphical representation 502 of the excitation variance, a graphical representation 504 the input modal variance (Var $[Z_D]$), a graphical representation 506 of the damping variance, and a graphical representation 510 of the cumulative variance determined using the law of total variance with respect to the frequency of the excitation energy 112. The display 600 of FIG. 6 depicts a graphical representation 602 of the mean reverberant response energy level with respect to the frequency of the excitation energy 112 and a graphical representation 610 of the maximum expected reverberant response energy level determined using a selected probability density function (e.g., a log-normal distribution), the selected percentile (or confidence level) (e.g., the $95^{th}$ percentile), and the cumulative variance depicted in FIG. 5.

Estimation of Component Variances

Each of the three component variances in the total variance formulation can be estimated in a number of practical ways as will be described here.

Excitation Variance

Figure 8:
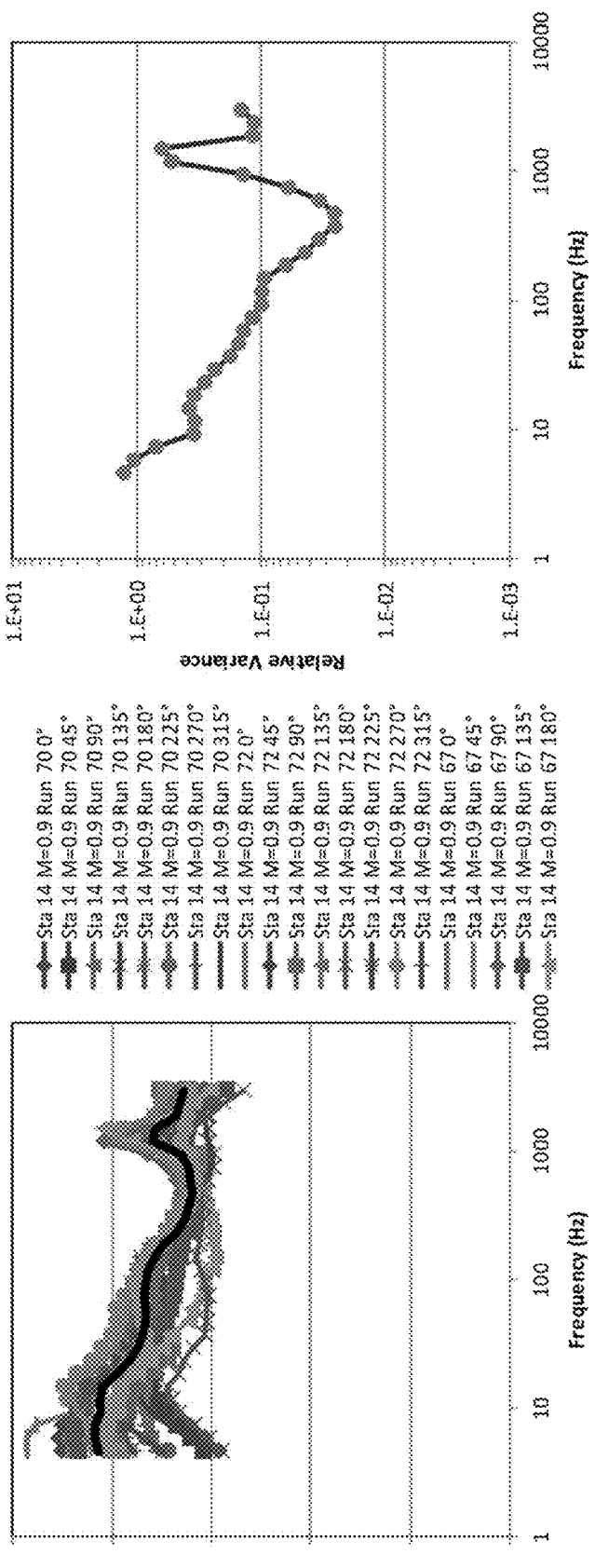
FIG. 8 depicts a graphical representation of an ensemble of measurement data for an input excitation energy and a corresponding excitation variance.

Both the mean and the relative variance of the excitation is often determined experimentally. A series of physical experiments are conducted to provide an ensemble of deterministic measurements of the excitation which is representative of uncertainly in the operating environment. The statistical mean and relative variance is computed from the ensemble of measurements. The excitation measurements can be taken on multiple instances of the physical subsystem and recorded under different operating conditions. For example, multiple flight aerodynamic pressure measurements on the surface of a launch vehicle at various locations on a panel and during for multiple separate flights. Alternatively, the excitation measurements can be made in a scaled or simulated test on a scaled or surrogate system model; for example, wind tunnel tests to measure the unsteady aerodynamic excitation on a model scale launch vehicle, as depicted in FIG. 8. In this regard, FIG. 8 depicts an ensemble of pressure measurement data corresponding to the excitation energy input to the launch vehicle model and the corresponding relative variance of the excitation energy. In a wind tunnel test, the uncertainty in excitation at any flight Mach number can be represented by the known dispersion in trajectory dynamic pressure and the estimated range of angles of attach, each of which can be varied systematically in the wind tunnel in a Monte Carlo sense. The relative variance of the ensemble of Monte Carlo experiments $X_i$ is determined by statistical analysis of the data in the form $$r^2(X) = \sum_{i=1}^{n} (X_i - \overline{X})^2 / (n-1)\overline{X}^2$$

where $$\overline{X} = (1/n) \sum_{i=1}^{n} X_i.$$

For an excitation source which is acts as a distributed load over an extended spatial domain such as a line or area or a volume, the excitation metric $X_i$ may be the space-averaged excitation energy level; that is, the line-average or the area-average or the volume average excitation energy level respectively.

The mean and the relative variance of the excitation can also be determined by a series of Monte Carlo parametric experiments on a simulation model of the system. A numerical or analytical model is set up for calculation of the excitation and repeated with parametric variations in the uncertain parameters of the excitation. For example, a transient computational fluid dynamics (CFD) simulation may be run to quantify the unsteady aerodynamic pressure excitation on a structural panel surface of an automobile or flight vehicle. Repeating or varying the CFD simulation in the uncertain excitation parameters such as Mach number, dynamic pressure and angle of attach will generate an ensemble of excitation level estimates. The relative variance of the ensemble of Monte Carlo simulations $X_i$ is determined by statistical analysis of the data in the form $$r^2(X) = \sum_{i=1}^{n} (X_i - \overline{X})^2 / (n-1)\overline{X}^2$$

where $$\overline{X} = (1/n) \sum_{i=1}^{n} X_i.$$

For an excitation source which is acts as a distributed load over an extended spatial domain such as a line or area or a volume, the excitation metric $X_i$ may be the space-averaged excitation energy level; that is, the line-average or the area-average or the volume average excitation energy level respectively.

Input Modal Variance

The mean and relative variance of the input modal power acceptance (or input modal mobility or input modal impedance) can be most conveniently estimated by a non-parametric modal variance formulation. These variance estimates can be used under circumstances of high modal overlap and/or high statistical overlap in the reverberant field. For reverberant wavefields in perfectly square or rectangular reverberant subsystems, Lyon [Jnl. Acoust. Soc. Amer. (1969) 45(3), 545-565] provides a non-parametric variance formulation based on a Poisson distribution of natural frequency spacings. For more realistic structures with quite general and irregular boundaries, Weaver [Jnl. Sound & Vibration (1989) 130(3), 487-491] has shown that the natural frequency spacings are more correctly described by Gaussian Orthogonal Ensemble (GOE) from random matrix theory. Weaver provides a non-parametric variance formulation for one or more point excitations applied to a reverberant wavefields. Langley and Brown [Jnl. Sound & Vibration (2004) 275, 823-846] have extended the work of Lyon and Weaver to provide a non-parametric variance formulation for quite general excitation, including partially-correlated random loading distributed over the surface of the reverberant wavefield subsystem. FIG. 9 depicts the relationship between the non-parametric mean and variance metrics (illustrated by lines 902 and 904) relative to parametric mean and variance metrics (illustrated by lines 912 and 914) for a particular set of statistical ensemble data.

When the statistics of the natural frequencies and mode shapes of the reverberant wavefield subsystem 104 are governed by the GOE, it is possible to predict the variance of the input modal power acceptance without knowing the precise details of the random variations in the properties of the reverberant subsystem 104 and/or medium 110. For the case where the variance of electromagnetic excitation energy is substantially equal to zero, the variance of the input power can be expressed as follows: $\text{Var}[P_{in,\Delta\omega}] = \langle P_{in,\Delta\omega} \rangle r^2(\alpha, m, B)$, where the $r^2$ term represents the relative variance of the modal response as a function of an excitation relative variance term ($\alpha$), a frequency averaging bandwidth parameter (B), and a modal overlap (m). The modal overlap may be determined as a function of the frequency, the mean Q factor, and the modal density ($\nu$) of the reverberant subsystem 104 and/or medium 110 using equation $$m = \frac{\omega \nu}{Q},$$

where $$\nu = \frac{V\omega^3}{\pi^2 c^3}.$$

The frequency averaging bandwidth parameter may be determined as a function of the frequency bandwidth $\Delta\omega$ and the Q factor using equation $$B = \frac{\Delta\omega Q}{\omega}.$$

The excitation relative variance is $\alpha = E[(j_r^2)^2]/E[(j_r^2)]^2$ where $j_r^2$ is the modal joint acceptance, a spatial double integral of the excitation cross correlation and the rth mode shape of the reverberant cavity. Langley and Brown have shown that the variance of this band-averaged complex modal integral converges smoothly to asymptotic values in the range $\alpha = 0 \to 3$, which can be determined from the number of spatial degrees of freedom associated with the excitation and from the known dimensionality of the reverberant wavefield.

For a frequency band integrated estimate of the input power the relative variance term may be determined from Langley and Brown [Jnl. Sound & Vibration (2004) 275, 847-857] using equation:

$$r^2(\alpha, m, B) = \frac{\alpha-1}{\pi m}\left(\frac{1}{B^2}\right)\left\{2B\left[\frac{\pi}{2} - \tan^{-1}\left(\frac{1}{B}\right)\right] - \ln(1+B^2)\right\} + \frac{1}{(\pi m)^2}\left(\frac{1}{B^2}\right)\ln(1+B^2).$$

Since this is defined when the excitation is known or controlled $\text{Var}(|h_{s,\Delta\omega}|^2)=0$, it follows that the variance of the frequency band averaged input modal power acceptance may be determined using this same non-parametric relative variance formulation: $\text{Var}[\text{Re}\{Z_D\}] = \langle \text{Re}\{Z_D\}\rangle^2 r^2(\alpha,m,B)$.

Alternatively, the relative variance of the input mobility can be determined by a series of Monte Carlo parametric tests on the physical subsystem or a surrogate subsystem. A physical wavefield sample is set up for testing with a controlled excitation in such a way that that the modal properties of the subsystem can be varied randomly to obtain an ensemble of subsystem input power acceptance measurements. For a vibration wavefield test, a sample panel may be configured with move-able point masses and/or move-able edge constraints that will vary the vibration modal frequencies and modes shapes, without significantly varying the modal damping. For an electromagnetic wavefield system, a sample cavity may be configured with a move-able reflecting surface—such as a "mode stirrer"—that will vary the cavity electromagnetic modal frequencies and mode shapes, without significantly varying the cavity Q factor (i.e., modal damping). The relative size of the physical perturbations in these Monte Carlo experiments only needs to be large enough to achieve statistical overlap i.e. the wavefield system must be sufficiently randomized for the standard deviation of the perturbations in natural frequency across the ensemble to exceed half the mean frequency spacing. The relative variance of any ensemble of measurements $X_i$—e.g. the input mobility or input impedance—is determined by statistical analysis of the data in the form $$r^2(X) = \sum_{i=1}^{n}(X_i - \overline{X})^2 / (n-1)\overline{X}^2$$

where $$\overline{X} = (1/n)\sum_{i=1}^{n} X_i.$$

The mean and the relative variance of the input mobility can also be determined by a series of Monte Carlo parametric experiments on a simulation model of the system. A numerical or analytical wavefield model is set up for calculation of input power acceptance with a specified excitation in such a way that that the modal properties of the subsystem can be varied randomly to obtain an ensemble of subsystem input mobility measurements. For a vibration wavefield experiment, multiple instances of a sample panel model may be configured with point masses and/or edge constraints in different spatial locations that will vary the vibration modal frequencies and modes shapes, without significantly varying the modal damping. Example shown in FIG. 9. For an electromagnetic wavefield system, a sample cavity may be simulated with a move-able boundary or move-able internal reflecting surface such as a "mode stirrer" that will vary the cavity electromagnetic modal frequencies and mode shapes, without significantly varying the cavity Q factor (i.e., modal damping). The relative size of the physical perturbations in these Monte Carlo simulations only needs to be large enough to achieve statistical overlap i.e. the wavefield subsystem must be sufficiently randomized for the standard deviation of the perturbations in natural frequency across the ensemble to exceed half the mean frequency spacing. The relative variance of the ensemble of Monte Carlo simulations $X_i$—e.g. the input mobility or input impedance—is determined by statistical analysis of the data in the form $$r^2(X) = \sum_{i=1}^{n}(X_i - \overline{X})^2 / (n-1)\overline{X}^2$$

where $$\overline{X} = (1/n)\sum_{i=1}^{n} X_i$$

Damping Variance

Figure 10:
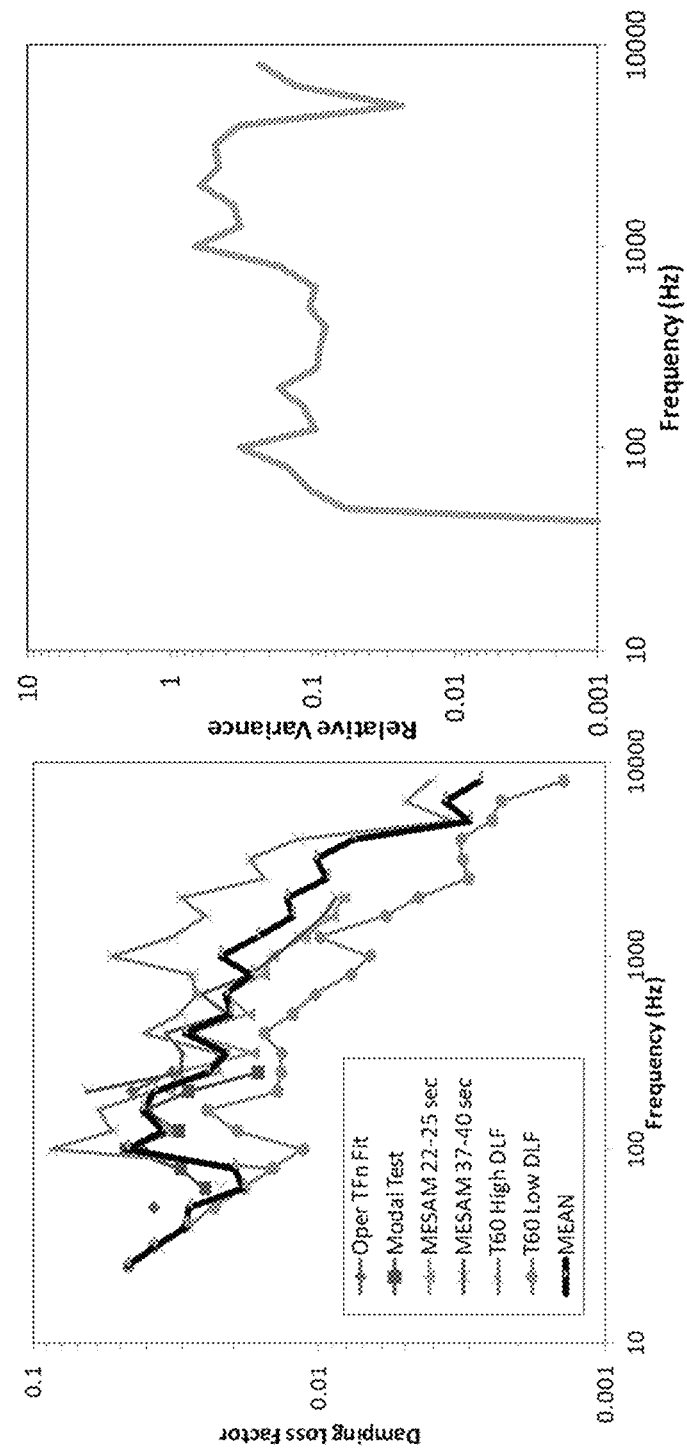
FIG. 10 depicts a graphical representation of an ensemble of damping loss factor measurement data and a corresponding damping variance.

The mean and the relative variance of the reverberant wavefield system effective damping loss factor or quality factor can be determined by a series of Monte Carlo parametric tests on the physical system or a surrogate system. A series of controlled experiments are conducted on a physical system with a representative reverberant wavefield. Since damping and related loss mechanisms are notoriously difficult to measure with a high degree of repeatability, the ensemble of loss factor estimates may include both physical perturbations in the surface damping or boundary energy loss mechanisms and may also include a variation in the method used to calculate damping from the series of controlled excitation input and measured energy output experiments. FIG. 10 depicts an example ensemble of empirically determined damping loss factor measurement data and the corresponding damping relative variance metric.

The mean and the relative variance of the reverberant wavefield system effective damping loss factor or quality factor can also be determined by a series of Monte Carlo parametric experiments on a simulation model of the system. A numerical or analytical wavefield model is set up for calculation of damping and dispersion loss mechanisms using a specified excitation input and calculated wavefield reverberant response energy. An ensemble of loss factor estimates may include both physical perturbations in the surface damping or boundary energy loss mechanisms modeled and variation in the method used to calculate damping from the series of controlled excitation input and measured energy output experiments. The relative variance of the ensemble of Monte Carlo experiments $X_i$ is determined by statistical analysis of the data in the form $$r^2(X) = \sum_{i=1}^{n} (X_i - \overline{X})^2/(n-1)\overline{X}^2$$

where $$\overline{X} = (1/n)\sum_{i=1}^{n} X_i.$$

Multiple Connected Reverberant Subsystems

As will now be described, the subject matter described above may be extended to multiple reverberant wavefield subsystems that interface or otherwise interact with one another to allow excitation energy and/or reverberant response energy to be transferred to/from one reverberant subsystem (or the bounded wavefield propagation medium associated therewith) from/to another reverberant subsystem (or the bounded wavefield propagation medium associated therewith). For example, excitation energy (e.g., excitation energy 112) may be input to a first reverberant subsystem (e.g., reverberant subsystem 104) at a first location (e.g., opening 113), with the medium where the reverberant response energy is generated (e.g., medium 110) interfaces with the medium of another reverberant subsystem (e.g., via another opening in the reverberant subsystem 104 that provides an interface between the first medium 110 and the medium associated with an adjacent reverberant subsystem). In this regard, the reverberant response of a network of multiple reverberant subsystems may be calculated or otherwise determined using an extension of power balance approach described above for a single excited subsystem which incorporates an additional power flow path for net power transfer between each connected subsystem, as shown schematically in FIG. 12. The net power transfer between wavefield subsystems depends on their relative energy level and a pair of power transfer coefficients between each connected subsystem which are commonly characterized by a coupling loss factors. An ensemble average estimate of each coupling loss factor can be determined by wave transmission and related simulation models or by a series of Monte Carlo experiments on a physical example of the connected subsystems. The mean response of each wavefield subsystem is determined by solving a power balance matrix for the network. The energy variance of each wavefield subsystem is obtained by determining an excitation variance associated with each respective reverberant subsystem of the network, determining a damping variance associated with each respective reverberant subsystem of the network, and determining a input modal variance associated with each respective reverberant subsystem of the network. Additionally, a coupling modal variance (or coupling loss factor variance) is determined for each pair of reverberant subsystems having bounded wavefield propagation mediums that interface or are otherwise coupled to one another. Thereafter, a cumulative variance for the entire network of reverberant subsystems may be determined using the law of total variance based on the excitation variances associated with the respective reverberant subsystems, the damping variances associated with the respective reverberant subsystems, the modal variances associated with the respective reverberant subsystems, and the coupling modal variances associated with the respective pairs of connected reverberant subsystems in the network.

Figure 11:
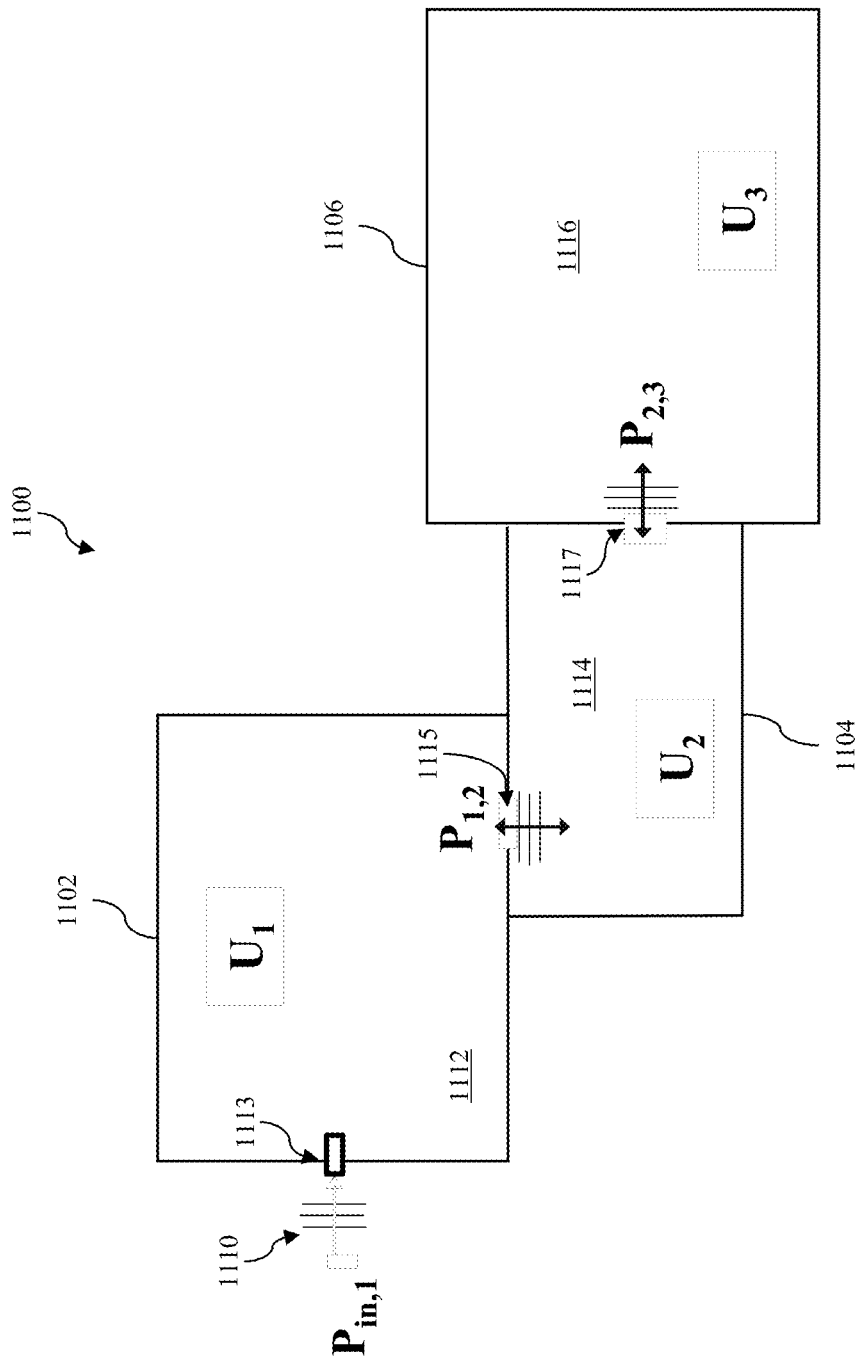
FIG. 11 depicts a block diagram of an exemplary network of connected reverberant systems.
Figure 12:
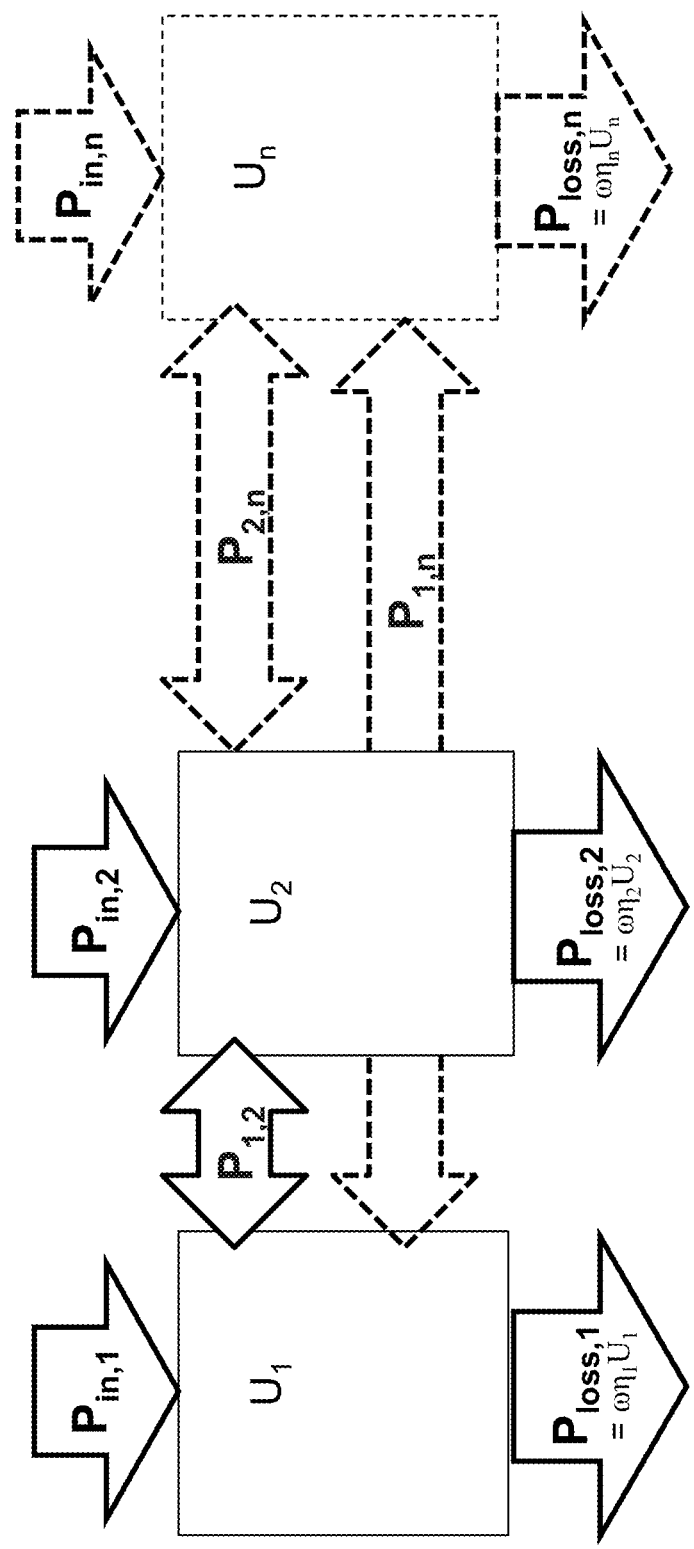
FIG. 12 depicts a graphical representation of the power balance for the individual reverberant subsystems within a network of connected reverberant systems.

FIGS. 11-12 depict a simplified representation of a network 1100 of multiple connected reverberant subsystems 1102, 1104, 1106 and a graphical representation of the power balance relationship for a network of n connected reverberant subsystems. As illustrated in FIG. 11, excitation energy 1110 input to the first reverberant subsystem 1102 at a first location (e.g., opening 1113) produces a corresponding reverberant response energy ($U_1$) within the bounded wavefield propagation medium 1112 associated with the first reverberant subsystem 1102. The medium 1112 of the first reverberant subsystem 1102 is coupled to the bounded wavefield propagation medium 1114 of a second reverberant subsystem 1104 at a second location (e.g., opening 1115), such that the reverberant response energy ($U_1$) is influenced by the energy transferred among the coupled mediums 1112, 1114 ($P_{1,2}$). Additionally, the medium 1114 of the second reverberant subsystem 1104 is coupled to the bounded wavefield propagation medium 1116 of a third reverberant subsystem 1106 at another location (e.g., opening 1117), such that the reverberant response energy ($U_2$) within the second medium 1114 is also influenced by the energy transferred among the coupled mediums 1114, 1116 ($F_{2,3}$), which, in turn, influences the energy transferred among the coupled mediums 1112, 1114. Thus, the medium 1112 of the first reverberant subsystem 1102 is indirectly coupled to the medium 1116 of the third reverberant subsystem 1106 via the second medium 1114. Accordingly, as depicted in FIG. 12, for n connected reverberant subsystems, the reverberant response energy of a particular reverberant subsystem is influenced by the excitation energy directly input to the respective reverberant subsystem (e.g., $P_{in,1}$), the energy dissipated by the effective damping losses of the respective reverberant subsystem (e.g., $P_{diss,1}$), and the net energy transfer (or coupling loss) resulting from the direct and/or indirect coupling to other reverberant subsystems (e.g., the reverberant energy coupling $P_{1,n}$).

As described in greater detail below, the variance associated with the additional aspect of coupling between connected subsystems can be determined using non-parametric models similar to those described above for the input modal variance, by considering the coupling power transfer as a product of an uncertain excitation defined by the driving subsystem energy level and the input modal variance (or modal uncertainty) of the receiving wavefield subsystem.

Coupling modal variance can also be empirically determined by applying controlled excitation energy to one of the connected subsystems and obtaining measurement data corresponding to the response energy levels of the respective connected subsystems to derive the coupling loss factors. Thereafter, the physical parameter(s) affecting uncertainty in the coupling loss factors may be varied in a controlled manner (e.g., using Monte Carlo or another technique) and repeating the steps of applying excitation energy to one of the connected subsystems, obtaining measurement data corresponding to the energy levels of the respective connected subsystems, and determining coupling loss factors for each different variation in the physical parameters. As described above, the measurement data for the different variations may be processed or otherwise analyzed to obtain statistical ensemble data corresponding to the relationship between the response energy levels in the various subsystems and the excitation energy with respect to frequency and the particular physical parameter(s) being varied, and the corresponding coupling variances determined based on the statistical ensemble data as described in greater detail below.

In other embodiments, a numerical or other mathematical model of the network of connected subsystems may be generated and utilized to simulate excitation of one or more of the reverberant subsystems and simulate varying one or more physical parameter(s) affecting uncertainty in the coupling loss factors to predict the reverberant response energy levels and calculate or otherwise determine an estimate of the coupling loss factors for each combination of excitation and physical parameter(s). Again, the simulation data for the different variations may be processed or otherwise analyzed to obtain statistical ensemble data, which, in turn, maybe utilized to determine the corresponding coupling variances. In yet other embodiments, a non-parametric equation or formula may be used to calculate or otherwise determine the coupling loss factor variances, as described in greater detail below.

In the field of vibro-acoustics, is has been shown that for random loading in any given frequency band, the time averaged (mean) energy flow between two dynamic systems is proportional to the difference in the modal energy of each system. Modal energy is total energy divided by modal density. Under the ergodic assumption, this result for random loading is able to be used to predict the energy flow between coupled systems of uncertain (random) dynamic properties, and for more general loading conditions (including single frequency harmonic loading). However, it has also been shown that the statistical variance about the predicted mean energy levels is strongly dependent on both the nature of the loading and the amount of "modal overlap" in the analysis frequency band; where modal overlap is the ratio of the average modal bandwidth to the average modal frequency spacing. In the limit of high modal overlap, the variance is small and the maximum expected level of response in a system of uncertain dynamic properties is close to the mean. An example is the high modal overlap or "over-moded" condition of the acoustic field in a correctly designed reverberant test chamber.

The mean energy difference result is robust across any two connected subsystems whose dynamics are characterized by reverberant wavefields, or a number of closely-spaced "modes" (or standing waves). It can therefore be applied to the problem of electromagnetic wavefield energy transmission between two coupled cavities. The result can be used in a power balance matrix formulation to predict the mean energy level in the electromagnetic fields of coupled cavities, for the case of "over-moded" cavities. Work on the statistics of electromagnetic fields in closed cavities has shown that the over-moded condition in electromagnetics is equivalent to the high modal overlap condition in more general statistical energy analysis of dynamical systems.

For reverberant fields at high modal overlap, the ensemble average energy flow between the subsystems (the net flow from subsystem 1 to subsystem 2) can be written in the form:

$$\hat{P}_{12} = \omega \eta_{12} n_1 \left( \frac{U_1}{n_1} - \frac{U_2}{n_2} \right),$$

where $\eta_{12}$ is known as the coupling loss factor. Methods of finding this factor for various types of coupling between the cavities are outlined Lyon & deJong [*Theory and Application of Statistical Energy Analysis*, Boston, Mass.: Butterworth-Heinemann, 1995]. Reciprocity implies that the coupling loss factors have the property $\eta_{12}n_1 = \eta_{21}n_2$, and that the ensemble average of the power lost in cavity i due to wall losses and other dissipative effects can be written as $P_{i,diss} = \omega \eta_i U_i$, where $\eta_i$ is the loss factor of the cavity, which is related to the quality factor (Q-factor) $Q_i$ via $\eta_i = 1/Q_i$. A power balance equation for cavity i can now be established by noting that the power dissipated plus the net power transferred to the other cavity, must be balanced by the ensemble average of the power input from sources, $P_{i,in}$ say, so that $P_{i,diss} + P_{ij} = P_{i,in}$. Combining these equations yields the following:

$$\begin{pmatrix} \omega\eta_1 n_1 + \omega\eta_{12} n_1 & -\omega\eta_{12} n_1 \\ -\omega\eta_{21} n_2 & \omega\eta_2 n_2 + \omega\eta_{21} n_2 \end{pmatrix} \begin{pmatrix} U_1/n_1 \\ U_2/n_2 \end{pmatrix} = \begin{pmatrix} P_{1,in} \\ P_{2,in} \end{pmatrix}.$$

The ensemble average of the power input by a source inside the cavity is equal to the power input to free space by the source, and this can readily be calculated. Similarly, the power input from an external field through an aperture or a wall can be calculated; thus the right hand side of the equation can be calculated, and the equation can then be solved to yield the ensemble averaged energies in the cavities, thereby allowing the fields in the cavities to be found.

The principal can be extended to the more general case of more than two reverberant subsystems. When multiple reverberant subsystems are inter-connected, each involving one or more instances of the canonical coupling mechanisms described above, the statistical mean and variance of the reverberant energy in each subsystem can be fully determined using the methodology presented above. In this case, the previous equation becomes:

$$\begin{pmatrix} \omega\eta_1 n_1 + \omega\sum_{j\neq 1}\eta_{1j}n_1 & -\omega\eta_{12}n_1 & \cdots & -\omega\eta_{1N}n_1 \\ -\omega\eta_{21}n_2 & \omega\eta_2 n_2 + \omega\sum_{j\neq 2}\eta_{2j}n_2 & \cdots & -\omega\eta_{2N}n_2 \\ \vdots & \vdots & \ddots & \vdots \\ -\omega\eta_{N1}n_N & -\omega\eta_{N2}n_N & & \omega\eta_N n_N + \omega\sum_{j\neq N}\eta_{Nj}n_N \end{pmatrix}$$

$$\begin{pmatrix} U_1/n_1 \\ U_2/n_2 \\ \vdots \\ U_N/n_N \end{pmatrix} = \begin{pmatrix} P_{1,in} \\ P_{2,in} \\ \vdots \\ P_{N,in} \end{pmatrix}$$

or in compact matrix notation $C\hat{U}=P$, where $\hat{U}_s = U_s/n_s$ is the modal energy and $U_s$ is the ensemble mean (statistically expected value) of energy in subsystem s. Two characteristics of this power balance matrix formulation should be noted as follows. First, that the C matrix can be expanded as the sum of a damping loss factor matrix and a coupling loss factor matrix $C = C_D + C_C$. $C_D$ is a diagonal matrix of only the subsystem damping loss terms:

$$C_D = \begin{bmatrix} \omega\eta_1 n_1 & 0 & \cdots & 0 \\ 0 & \omega\eta_2 n_2 & \cdots & 0 \\ \vdots & \vdots & \ddots & \vdots \\ 0 & 0 & \cdots & \omega\eta_N n_N \end{bmatrix}.$$

$C_C$ is a symmetric matrix of coupling loss terms:

$$C_C = \begin{bmatrix} \omega \sum_{j \neq 1} \eta_{1j} n_1 & -\omega \eta_{12} n_1 & \cdots & -\omega \eta_{1N} n_1 \\ -\omega \eta_{21} n_2 & \omega \sum_{j \neq 2} \eta_{2j} n_2 & \cdots & -\omega \eta_{2N} n_2 \\ \vdots & \vdots & \ddots & \vdots \\ -\omega \eta_{N1} n_N & -\omega \eta_{N2} n_N & \cdots & \omega \sum_{j \neq N} \eta_{Nj} n_N \end{bmatrix}.$$

Second, that the vector of statistical mean modal energy responses for each subsystem $\hat{U}$ can be obtained from the vector of the mean excitation power inputs to each subsystem P, multiplied by the inverse of the C matrix: $\hat{U} = C^{-1} P$.

Cumulative Variance for Multiple Connected Reverberant Subsystems

The cumulative variance concept developed for a single reverberant subsystem can be extended in matrix and vector form for multiple connected reverberant subsystems. It will be somewhat simpler to show the development of multiple subsystem cumulative variance for the case of vibro-acoustic subsystems (for which the individual reverberant wavefield energies are scalar, rather than vector quantities); however the same method can also be used to develop cumulative variance for multiple connected electromagnetic subsystems. In the vibro-acoustic case, the power input to the subsystem reverberant wavefield from the applied excitation is the space integral of the co-spectrum of the RMS excitation force $F_k^*(\omega)$ and the RMS subsystem vibration response $v_k(\omega)$: $P_k(\omega) = \text{Re}[F_k^*(\omega) v_k(\omega)] = S_{ff}(\omega) \text{Re}[M_k(\omega)]$, where $S_{ff,k}(\omega)$ is the space-averaged force autospectrum exciting subsystem k and $M_k(\omega)$ is the subsystem input mobility. In compact vector form, for multiple connected subsystems, the input power vector P=SM is a vector representation of power inputs to each subsystem from their respective excitation energies, of the form $P_j = S_{ff,j} \text{Re}[M_j]$.

From the foregoing power balance matrix formulation for the mean reverberant energy levels, it follows that the cumulative variance in the subsystem modal energies is $\text{Var}(\hat{U}) = \text{Var}(C^{-1} P)$. To estimate the cumulative variance for multiple connected reverberant subsystems, it is necessary to assume uncertainty in both the excitation force vector $S_{ff}$ and uncertainty in the subsystem input modal mobility vector M, to define the variance of the power input vector P. This is the same as for the cumulative variance of a single reverberant subsystem. However, for a network of connected reverberant subsystems, it is also necessary to estimate the variance associated with the coupling matrix C in terms of an uncertainty in the damping loss factors $\eta_k = 1/Q_k$ (where Q is the Quality factor for modes of the kth subsystem) and a separate uncertainty in the coupling loss factors, as these are generally statistically independent, such that $\text{Var}(C) = \text{Var}(C_D) + \text{Var}(C_C)$. The variance associated with the coupling matrix $C_C$ is alternatively referred to herein as the coupling loss factor variance or coupling modal variance (or simply, the coupling variance).

The cumulative variance of each connected subsystem can be estimated using a perturbation analysis of each constituent uncertainty in the power balance matrix. Taking $S_{ff} = \bar{S} + S'$ where $\bar{S}$ is the mean and $S'$ is an explicit (single instance) perturbation about the mean; and similarly $M = \bar{M} + M'$, $C_D = \bar{C}_D + C_D'$, $C_C = \bar{C}_C + C_C'$, it is convenient to write ($\bar{C} + C_D' + C_C') U = \bar{S} \bar{M} + \bar{S} M' + S' \bar{M} + S' M'$. Assuming each of the explicit perturbations are small with respect to the mean, terms which are second order in the perturbations can be neglected to yield the following expression for the corresponding explicit deviations in the subsystem energies: $U - \bar{U} \cong \bar{C}^{-1} \bar{S} M' + \bar{C}^{-1} S' \bar{M} - \bar{C}^{-1} C_D' \bar{U} - \bar{C}^{-1} C_C' \bar{U}$.

The cumulative statistical variance in the subsystem energies is the expected value (e.g., the average) of the square of these energy variations $\text{Var}(U) = E[(U - \bar{U})^2]$. It follows that the first order estimate of the total variance of response energy for any reverberant subsystem in a multiply connected network has at least four contributors:

$$\text{Var}(\hat{U}_j) = \sum_k (\overline{C_{jk}^{-1}} \, \bar{S}_{ff,k})^2 \text{Var}(M_k) + \sum_k (\overline{C_{jk}^{-1}} \, \bar{M}_k)^2 \text{Var}(S_{ff,k}) +$$
$$\sum_k (\overline{C_{jk}^{-1}} \, \bar{U}_k)^2 \text{Var}(C_{D,k}) + \sum_k \sum_{s \neq k} [(\overline{C_{jk}^{-1}} - \overline{C_{js}^{-1}}) \bar{U}_s]^2 \text{Var}(C_{C,ks}).$$

The first term is the input modal variance due to uncertainty in the modal parameters (natural frequency and mode shape) of each subsystem, as they effect the average input mobility (or input power acceptance) of each power input. The second term is the excitation variance due to uncertainty in the force spectrum of each excited subsystem, weighted by their individual contribution to total power input to the system. The third term is the damping variance due to uncertainty in the damping loss factors of each of the connected subsystems, weighted by their individual contribution to total power lost (output) by the system. The fourth term is the coupling modal variance due to uncertainty in each of the coupling loss factors, which quantify energy exchange between each of the connected subsystems. All of the terms with overbars are statistical mean quantities are therefore already defined and available from the power balance matrix solution of the mean subsystem energies. The estimation of variance in the excitation $\text{Var}(S_{ff,k})$ and the variance in the subsystem input mobility $\text{Var}(M_k)$ and the variance in the subsystem damping $\text{Var}(C_{j,k})$ can all be estimated using the same methods as described above, for a single reverberant subsystem.

Figure 13:
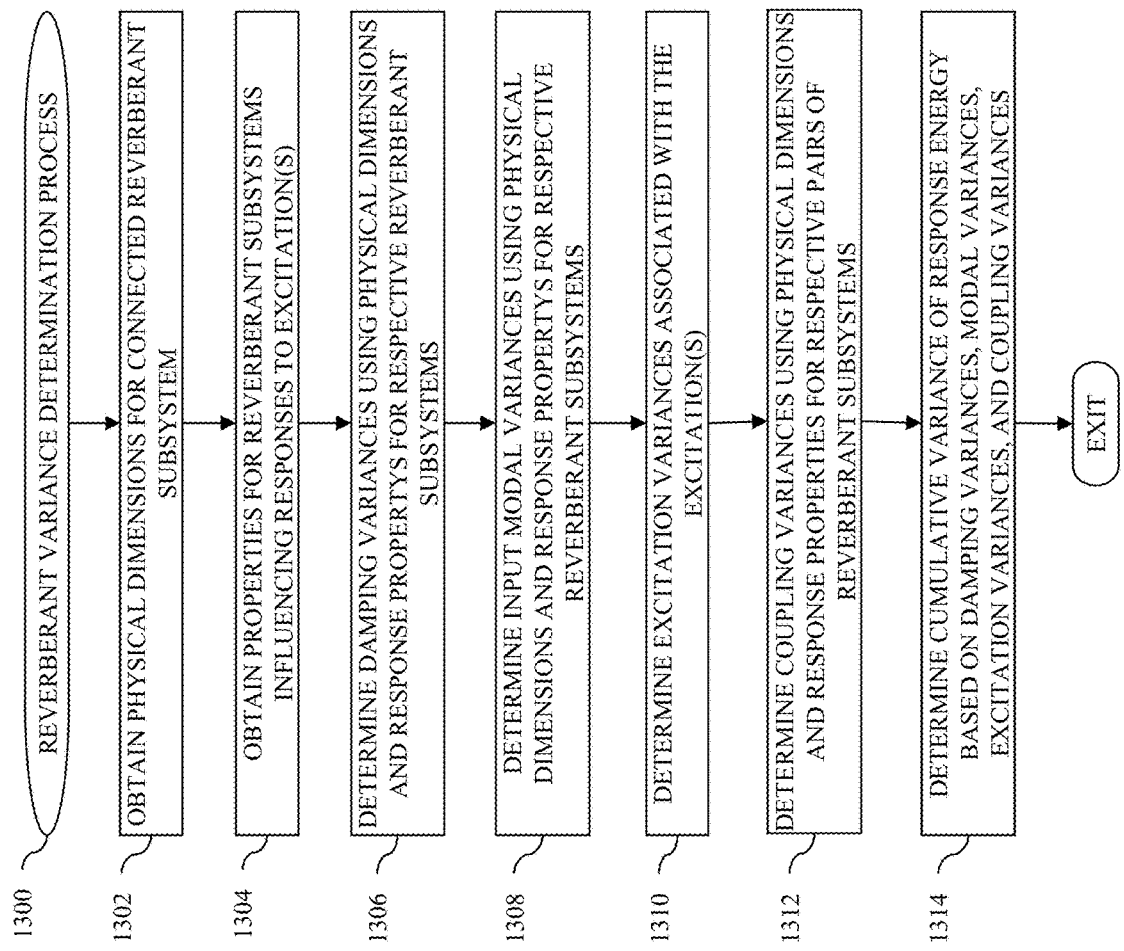
FIG. 13 is a flow diagram that illustrates an exemplary reverberant variance determination process suitable for use with a network of connected reverberant systems.

FIG. 13 depicts an exemplary embodiment of a reverberant variance determination process 1300 that may be implemented or otherwise performed by the processing system 106 in FIG. 1 and/or the computing system 200 of FIG. 2 to characterize the reverberant response of a network of connected reverberant subsystems. The various tasks performed in connection with the illustrated process 1300 may be implemented using hardware, firmware, software executed by processing circuitry, or any combination thereof. For illustrative purposes, the following description may refer to elements mentioned above in connection with FIG. 1 or FIG. 2. It should be appreciated that the reverberant variance determination process 1300 may include any number of additional or alternative tasks, the tasks need not be performed in the illustrated order and/or the tasks may be performed concurrently, and/or the reverberant variance determination process 1300 may be incorporated into a more comprehensive procedure or process having additional functionality not described in detail herein. Moreover, one or more of the tasks shown and described in the context of FIG. 13 could be omitted from a practical embodiment of the reverberant variance determination process 1300 as long as the intended overall functionality remains intact.

In a similar manner as described above in the context of FIG. 3, the reverberant variance determination process 1300 begins by obtaining or otherwise identifying physical dimensions and/or physical properties for each respective reverberant subsystem in the network of connected reverberant subsystems being analyzed (tasks 1302, 1304). Thereafter, the reverberant variance determination process 1300 continues by calculating or otherwise determining, for each respective subsystem in the network, the damping variance and the input modal variance associated with that respective subsystem (tasks 1306, 1308). The reverberant variance determination process 1300 also calculates or otherwise determines, for each respective excitation source providing excitation energy to the network of connected reverberant subsystems, a variance associated with the respective excitation energy at each respective location within the network where that respective excitation energy is input (task 1310).

The reverberant variance determination process 1300 continues by calculating or otherwise determining the coupling loss factor variance associated with each respective pair of reverberant subsystems within the network of connected reverberant subsystems (task 1312). As described in greater detail below, the coupling loss factor variances can be determine non-parametrically or in a parametric manner by performing Monte Carlo experiments (or a similar parametric testing technique). After the various variances within the network of connected reverberant subsystems are determined, the process 1300 calculates or otherwise determines the cumulative variance associated with the reverberant response of the connected reverberant subsystems (task 1314), in a similar manner as described above.

Estimation of Coupling Loss Factor Variance

The variance in the coupling loss factor terms can be obtained in a similar manner as the methods described for estimating input modal variance (or variance in the input mobility, by considering the coupling power transfer as a product of an uncertain excitation defined by the driving subsystem energy level and the input modal variance (or coupling modal uncertainty) of the receiving wavefield subsystem. The variance in the coupling loss factor can thus be determined using a non-parametric formulation. For example $\text{Var}[C_{C,ks}] \equiv \text{Var}[\eta_{ks}] = \langle \eta_{ks} \rangle^2 r^2(\alpha_{ks}', m_k', B_k')$ where the effective subsystem loss factor $\eta_k' = 1/(\omega \eta_k C_{kk}^{-1})$, the effective modal overlap $m_k' = \omega \eta_k' n_k$ and the effective bandwidth ratio $B_k' = \Delta\omega/(\omega \eta_k')$. The coupling excitation relative variance is $\alpha_{ks} = E[(j_r^2)^2]/E[(j_r^2)]^2$ where $j_r^2$ is the modal joint acceptance, a spatial double integral of the driving subsystems excitation energy cross correlation and the rth mode shape of the energy receiving reverberant wavefield. The variance of this band-averaged complex modal integral converges smoothly to asymptotic values in the range $\alpha = 0 \to 3$, which can be determined from the number of spatial degrees of freedom associated with the excitation and from the known dimensionality of the coupling boundary. The relative variance may be determined using equation:

$$r^2(\alpha_{ks}, m_k', B_k') = \frac{\alpha_{ks}-1}{\pi m'} \left(\frac{1}{B_k'^2}\right) \left\{ 2B_k' \left[\frac{\pi}{2} - \tan^{-1}\left(\frac{1}{B_k'}\right)\right] - \ln(1+B_k'^2) \right\} + \frac{1}{(\pi m')^2}\left(\frac{1}{B_k'^2}\right)\ln(1+B_k'^2).$$

The variance in the coupling loss factors can also be obtained by Monte Carlo experiments which measure estimates of coupling loss factors with parametric variation in the modal parameters of the transmitting and receiving wavefield subsystems. The Monte Carlo experiments can be performed on a physical test specimen of representative connected wavefield subsystems. The Monte Carlo experiments can also be performed on a numerical model of the connected wavefield subsystems. For example, an orbiting satellite having a cylindrical body and multiple panels connected thereto may be modeled as a network of connected reverberant subsystems, where the cylindrical body and each of the panels represents a respective reverberant subsystem such as the surrogate satellite test structure 1400 shown in FIG. 14. The vibration behavior may be characterized by applying a controlled excitation to one of the panels (e.g., a first reverberant subsystem) and the energy response is measured in that panel (e.g., the driven wavefield subsystem) and for the remaining panels and the body (e.g., the wavefield subsystems directly and/or indirectly connected to the driven wavefield subsystem) to obtain an estimate of the coupling loss factors. By repeating the experiments with move-able masses and/or variable boundary constraints, and ensemble of coupling loss factor estimates can be obtained. The relative variance of the ensemble of Monte Carlo experiments $X_i$ is determined by statistical analysis of the data in the form $$r^2(X) = \sum_{i=1}^{n} (X_i - \overline{X})^2/(n-1)\overline{X}^2$$

where $$\overline{X} = (1/n)\sum_{i=1}^{n} X_i.$$

Figure 14:
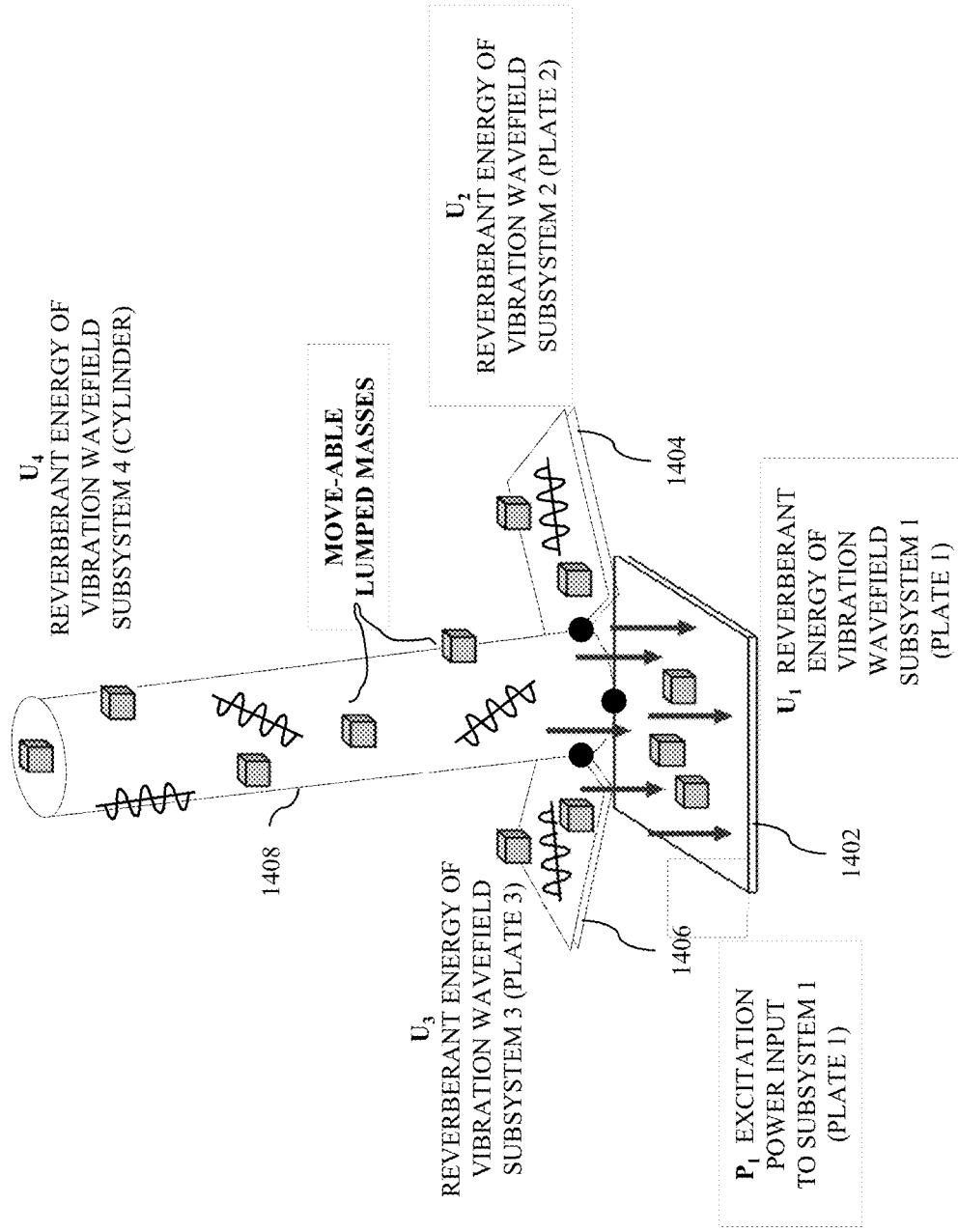
FIG. 14 depicts an representation of the connected vibration wavefield in an exemplary satellite structure showing the small moveable masses used to vary each wavefield subsystems modal parameters to obtain an ensemble measurements suitable for defining the mean and variance of each coupling loss factor.
Figure 15:
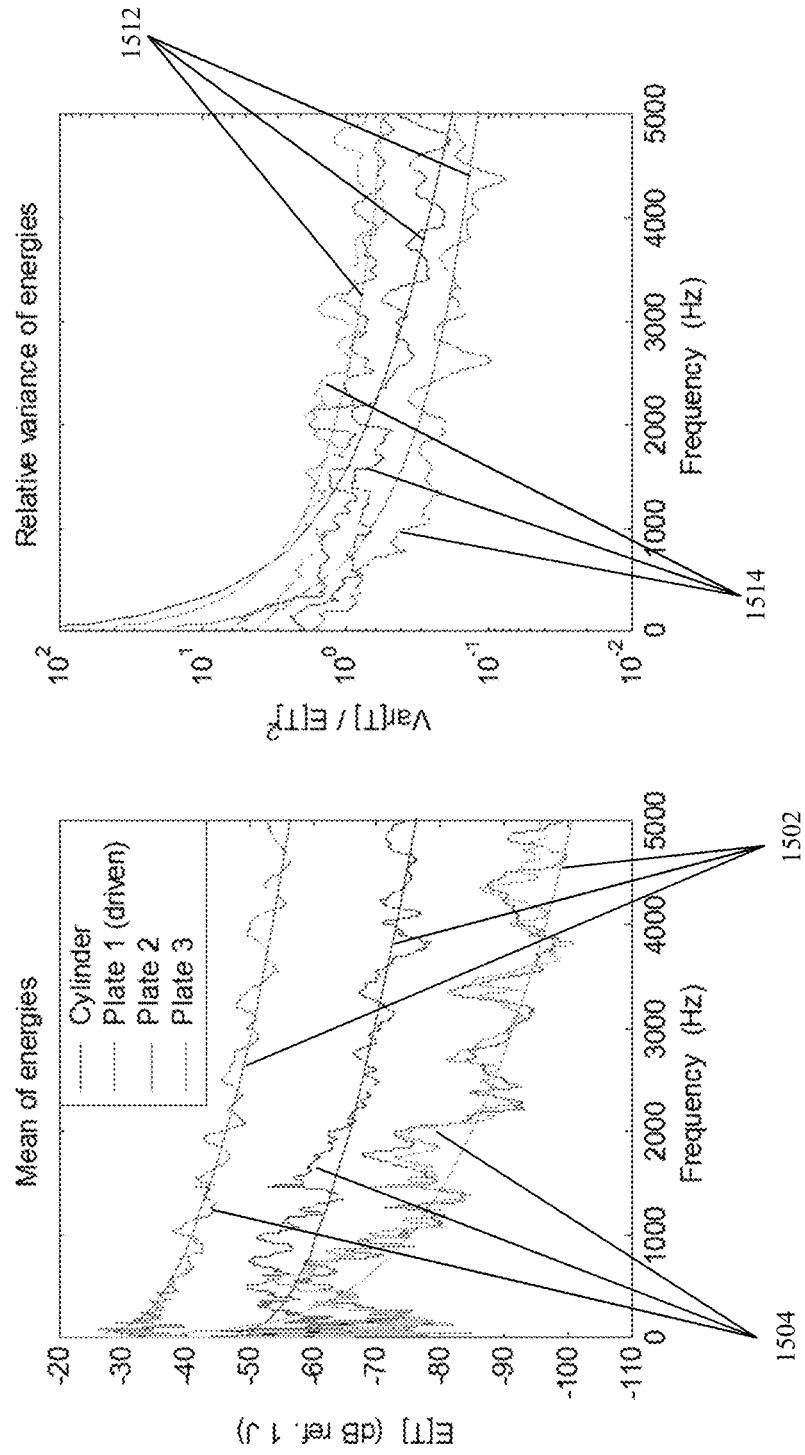
FIG. 15 depicts graphical representations of an ensemble of energy simulations mean and variance energy response metrics of multiple coupled wavefield subsystems in the satellite structure of FIG. 14 comparing use of non-parametrically-determined coupling loss factor variances to use of parametrically-determined coupling loss factor variances.

FIG. 15 depicts the relationship between the non-parametric mean and variance metrics relative to parametric mean and variance metrics for a particular set of statistical ensemble data and the satellite test structure 1400 of FIG. 14. In this regard, FIG. 15 includes graphical representations 1502, 1512 of the mean and variance energy response metrics for the panel structures 1404, 1406 and cylindrical structure 1408 of the test structure 1400 in response to an excitation applied to a first panel structure 1402 that were determined using non-parametrically-determined coupling loss factor variances. FIG. 15 also includes graphical representations 1504, 1514 of the mean and variance energy response metrics for the panel structures 1404, 1406 and cylindrical structure 1408 in response to the excitation applied to the first panel structure 1402 that were determined using parametrically-determined coupling loss factor variances.

Response of Deterministic Subsystem in Reverberant Field

Figure 16:
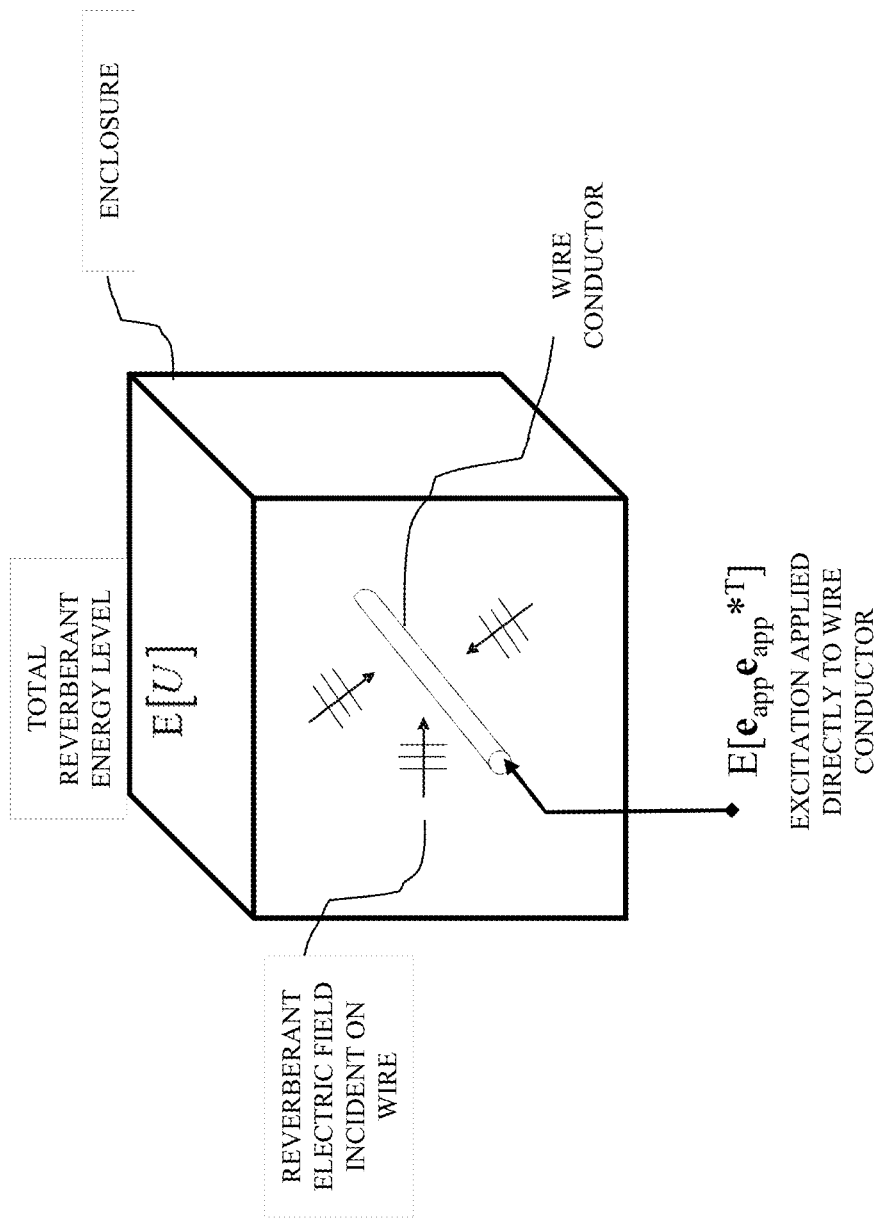
FIG. 16 depicts a graphical representation of a deterministic subsystem, such as a wire conductor, immersed in a reverberant medium or reverberant wavefield subsystem.

In some engineering applications, it is desirable to predict the mean and maximum expected response of a dynamically deterministic subsystem which is immersed within a reverberant wavefield or is connected to one or more reverberant wavefield subsystems. In the field of electromagnetics, for example, the dynamic response of a wire or transmission line is described by standing waves or modes, but due to the low dimensionality of the wire, the modal density and modal overlap are not high enough to support a uniform reverberant wavefield response. The modal dynamics of the magnetic field and current in a wire is more appropriately modeled deterministically using numerical methods such as finite element analysis or boundary element analysis or equivalent transmission line discretization models. Deterministic wiring models may include interaction with line components and interaction with terminating electronic systems described by measured or calculated S-parameter characteristics. However, excitation of the magnetic field in the wire h($\underline{x}$,ω) can include currents induced by the reverberant electromagnetic field energy U(ω) surrounding the wire (e.g., a vehicle cavity or a shielding enclosure), as well as excitation by more deterministic electric field or voltage excitation $e_{app}$($\underline{x}$,ω) applied directly to the wire conductor. An exemplary wire conductor immersed in a reverberant electromagnetic field is shown in FIG. 16.

Since the electric and magnetic fields in a highly reverberant (or electrically large) electromagnetic wavefield of energy level U(ω) can only be described statistically, it follows that the magnetic field and currents induced in a deterministic wire by a reverberant field can also only be described statistically; i.e., by a modulus-squared value such as E[hh*$^T$] and variance var[hh*$^T$], from which a maximum expected response can be obtained. The statistical mean induced current can be estimated by averaging an ensemble of numerical solutions from multiple Monte Carlo uncertainty variations of how the electric field impinges the wire (e.g., different azimuth angles, different polarization angles, etc.). A faster technique is to use the principle of diffuse field reciprocity described by Shorter and Langley [J. Acoust. Soc. Amer. (2005) 117 (1), pp. 85-95], to determine the mean-squared magnetic field of the wire $$E[hh^{*T}] = Z_T^{-1}\left\{E[e_{app}e_{app}^{*T}] + \left(\frac{4E[U]}{\omega^2\pi\nu}\right)Z_{DH}\right\}Z_T^{-T^*}$$

where the total electrical impedance on the wire surface $Z_T = Z_D + Z_C$; $z_D$ is the surface "free radiation impedance" outwards into an infinitely extended electromagnetic field; $z_C$ is the surface impedance for the electromagnetic field insider the conductor. The first term within the braces is the expected value (or mean) of the modulus-squared effective electric field $e_{app}$($\underline{x}$,ω) applied directly to the wire (e.g., a current or voltage applied at ends of the wire). The second term in the braces is the mean value of the electric field impinging on the wire from the electromagnetic field in the surrounding reverberant wavefield with energy U(ω), where the modal density $$\nu = \frac{V\omega^3}{\pi^2 c^3}$$

and $z_D$ is the Hermitian part of the wire free radiation impedance.

The variance in the wire magnetic field and related current response will be largely attributable to the variance in the reverberant electric field energy level Var[U] and can be determined using the following equation:

$$\text{Var}[(hh^{*T})_{ij}] = \left(\frac{8}{\pi\nu}\right)E[U](Z_T^{-1}E[e_{app}e_{app}^{*T}]Z_T^{-T^*})_{ij}(Z_T^{-1}Z_{DH}Z_T^{-T^*})_{ij} + \left(\frac{16}{\pi^2\nu^2}\right)\{2\text{Var}[U] + (E[U])^2\}(Z_T^{-1}Z_{DH}Z_T^{-T^*})_{ij}^2,$$

where in the most general case, Var[U] is the total variance of the reverberant energy level in the electromagnetic field surrounding the wire. The total variance can be determined using the excitation variance estimation, the effective damping variance estimators, the input modal power acceptance variance estimators and the coupling loss factor variance estimators as described for reverberant wavefield subsystems above.

The maximum expected response of the deterministic wire can be determined by choosing an appropriate probability density function for the wire magnetic field or current and using the estimated means E[hh*$^T$] and E[U] and the total variance Var[U] to predict the maximum expected value for any given tolerance interval or confidence level.

CONCLUSION

To briefly summarize, the subject matter described herein allows for reliably determining the maximum expected response in a random and uncertain reverberant dynamic system where the variance of the reverberant response cannot readily be determined by direct simulation (or other computer modeling) of the full system dynamics over the frequency range of interest and over all anticipated uncertainties in the systems many parameters. A cumulative variance associated with the reverberant system is determined by combining the respective variances associated with the excitation source, the input modal power acceptance of the reverberant system response, the effective damping loss (or Q factor) of the reverberant system—and for multiple connected subsystems, the coupling modal variance—using the law of total variance. The cumulative variance can then be used with the mean response (which may be estimated by simulation or directly measured and calculated) of the reverberant system to determine a maximum expected response with a desired level of confidence with a selected probability density function. In this manner, engineers or designers of a reverberant system can reliably design and test the reverberant system to better withstand the random, uncertain and/or unknown environment to which the reverberant system may be subjected to.

For purposes of explanation, the subject matter may be described herein in terms of functional and/or logical block components, and with reference to symbolic representations of operations, processing tasks, and functions that may be performed by various computing components or devices. Such operations, tasks, and functions are sometimes referred to as being computer-executed, computerized, or computer-implemented. In this regard, it should be appreciated that the various block components shown in the figures may be realized by any number of components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A computer-implemented method of characterizing a maximum expected response of a reverberant wavefield within a physical system which provides wave reflecting boundaries resulting in a reverberant subsystem with uncertain physical parameters, the method comprising:

determining, by a processing system based on first ensemble of data corresponding to a first location where reference excitation energy is input to the reverberant wavefield within the physical system, a first variance associated with the excitation energy exposed to the reverberant subsystem, wherein the first variance represents uncertainty in an amplitude of the excitation energy with respect to frequency and the reference excitation energy comprises at least one of electromagnetic waves or mechanical waves;

determining, by the processing system based on second ensemble of data corresponding to a second location within the reverberant wavefield within the physical system, a second variance associated with the damping provided by the reverberant subsystem, wherein the second variance represents uncertainty in the damping provided by the reverberant subsystem with respect to frequency;

generating a model of the reverberant subsystem and an excitation source providing the excitation energy;

simulating operation of the excitation source providing varying excitation energies using the model while varying a characteristic of the reverberant subsystem influencing an input modal power acceptance, resulting in simulation data representative of reverberant response energies in the reverberant subsystem, wherein the varying of the excitation energies and the varying of the characteristic are representative of uncertainty in the input modal power acceptance of the reverberant subsystem;

determining, by the processing system, a third variance associated with the input modal power acceptance of the reverberant subsystem based at least in part on the simulation data;

determining, by the processing system, a cumulative variance with respect to frequency based on the first variance, the second variance, and the third variance;

determining, by the processing system, the maximum expected reverberant response with respect to frequency for the reverberant wavefield within the physical system using the cumulative variance; and displaying an output influenced by the maximum expected reverberant response for the reverberant wavefield within the physical system on a display device coupled to the processing system.

2. The method of claim 1, wherein determining the cumulative variance comprises combining the first variance, the second variance, and the third variance.

3. The method of claim 1, further comprising:

obtaining a mean reverberant response associated with the reverberant subsystem in response to the excitation energy, wherein determining the maximum expected reverberant response comprises determining a maximum expected value for the reverberant response based on the mean reverberant response and the cumulative variance, wherein displaying the output comprises displaying a graphical representation of the maximum expected value on the display device.

4. The method of claim 3, further comprising obtaining a probability density function for the reverberant response, wherein determining the maximum expected value comprises obtaining the maximum expected value as a percentile of the probability density function using the mean reverberant response and the cumulative variance.

5. The method of claim 1, wherein determining the first variance associated with the excitation energy comprises:

operating an excitation source to provide reference excitation energy;

obtaining one or more measurements of the reference excitation energy from a sensing element at a location where the reference excitation energy is input to the reverberant subsystem; and determining the first variance based at least in part on the one or more measurements.

6. The method of claim 1, wherein determining the first variance associated with the excitation energy comprises:

generating a second model of the reverberant subsystem and the excitation source providing the excitation energy;

simulating operation of the excitation source providing varying excitation energies using the second model, resulting in second simulation data representative of the varying excitation energies applied to the reverberant subsystem, wherein the varying excitation energies are representative of uncertainty in an operating environment of the reverberant subsystem; and determining the first variance based on the second simulation data.

7. The method of claim 1, the excitation energy being provided by the excitation source, wherein determining the second variance associated with the damping comprises:

operating the excitation source to provide reference excitation energies;

obtaining measurement data corresponding to responses to the reference excitation energies from a sensing element within the reverberant subsystem; and determining the second variance based on the measurement data.

8. The method of claim 1, wherein determining the second variance associated with the damping comprises:

obtaining one or more physical dimensions associated with the reverberant subsystem;

obtaining one or more properties associated with the reverberant subsystem;

generating a second model of the reverberant subsystem based on the one or more physical dimensions and the one or more properties;

simulating a response to the excitation energy using the second model, resulting in second simulation data corresponding to responses of the reverberant subsystem for parametric variations of the one or more physical dimensions or the one or more properties; and determining the second variance based on the second simulation data.

9. The method of claim 1, wherein determining the third variance associated with the input modal power acceptance comprises determining an input modal variance using a non-parametric modal variance formulation.

10. The method of claim 1, wherein determining the third variance associated with the input modal power acceptance comprises:

operating the excitation source to provide reference excitation energies;
varying a characteristic of the reverberant subsystem while operating the excitation source to provide the reference excitation energies, the varying of the characteristic representing uncertainty in the input modal power acceptance of the reverberant subsystem;
obtaining, from a sensing element within the reverberant subsystem, measurement data corresponding to responses to the reference excitation energies while varying the characteristic; and
determining the third variance based at least in part on the measurement data.

11. The method of claim 10, wherein the characteristic is a physical dimension or property.

12. The method of claim 1, the physical system comprising a structure, the method further comprising:
obtaining first measurement data from a first sensing element at the location where reference excitation energy is input to the structure;
obtaining second measurement data from a second sensing element at the second location within the structure, wherein:
determining the first variance comprises determining the first variance based on the first measurement data;
determining the second variance comprises determining the second variance based on the second measurement data;
the maximum expected reverberant response comprises a maximum expected time-averaged mean-squared response of the reverberant wavefield within the structure; and
the output comprises a graphical representation of the maximum expected time-averaged mean-squared response with respect to frequency.

13. A non-transitory computer-readable medium having instructions stored thereon executable by a processing system to:
obtain first data indicative of excitation energy exposed to a physical system which provides wave reflecting boundaries resulting in reverberant wavefield within a reverberant subsystem with uncertain physical parameters, the excitation energy comprising at least one of electromagnetic waves or mechanical waves;
determine a first variance associated with the excitation energy based on a first ensemble of data corresponding to a first location where the excitation energy is input to the reverberant wavefield within the physical system, wherein the first variance represents uncertainty in an amplitude of the excitation energy with respect to frequency;
obtain second ensemble of data indicative of a damping provided by the reverberant subsystem;
determine a second variance associated with the damping based on the second ensemble of data, wherein the second variance represents uncertainty in the damping provided by the reverberant subsystem with respect to frequency;
generate a model of the reverberant subsystem and an excitation source providing the excitation energy;
simulating operation of the excitation source providing varying excitation energies using the model while varying a characteristic of the reverberant subsystem influencing an input modal power acceptance, resulting in simulation data representative of reverberant response energies in the reverberant subsystem, wherein the varying of the excitation energies and the varying of the characteristic are representative of uncertainty in the input modal power acceptance of the reverberant subsystem;
determine a third variance associated with the input modal power acceptance of the reverberant subsystem based at least in part on the simulation data;
determine a cumulative variance associated with a reverberant response by the reverberant subsystem with respect to frequency based on the first variance, the second variance, and the third variance;
determine a maximum expected reverberant response with respect to frequency for the reverberant wavefield within the physical system using the cumulative variance; and
display an output influenced by the maximum expected reverberant response for the reverberant wavefield within the physical system on a display device.

14. A computer-implemented method of characterizing a reverberant response of a network of multiple inter-connected reverberant subsystems with uncertain parameters, wherein each of the multiple inter-connected reverberant subsystems comprises a respective physical system which provides wave reflecting boundaries resulting in a reverberant wavefield within the respective reverberant subsystem of the multiple inter-connected reverberant subsystems, the method comprising:
determining, by a processing system, a first variance associated with an excitation energy applied to each of the reverberant subsystems in the network, the excitation energy comprising at least one of electromagnetic waves or mechanical waves, resulting in a first plurality of excitation variances representing uncertainty in an amplitude of the excitation energy applied to each of the reverberant subsystems with respect to frequency;
determining, by the processing system, a second variance associated with a damping provided by each of the reverberant subsystems in the network, resulting in a second plurality of damping variances representing uncertainty in the damping provided by the each of the reverberant subsystems with respect to frequency;
determining, by the processing system, a third variance associated with an input modal power acceptance associated with each of the reverberant subsystems in the network, resulting in a third plurality of input modal variances;
determining, by the processing system, a fourth variance associated with a coupling loss factor between each respective pair of reverberant subsystems in the network, resulting in a fourth plurality of coupling variances, wherein determining the fourth variance associated with the coupling between each respective pair of reverberant subsystems in the network comprises:
generating a model of the network;
simulating excitation of one or more reverberant subsystems in the network using the model;
varying a characteristic of one or more of the reverberant subsystems in the model while simulating the excitation, the characteristic influencing the coupling of energy with the one or more of the reverberant subsystems, the varying of the characteristic being representative of uncertainty in the coupling of one or more pairs of the reverberant subsystems in the network;
obtaining simulation data corresponding to reverberant energies of the reverberant subsystems in the network in response to the simulated excitation while varying the characteristic; and determining the fourth variance based on the simulation data;

determining, by the processing system, a cumulative variance associated with the reverberant response of the network of multiple inter-connected reverberant subsystems with respect to frequency based on the first plurality of excitation variances, the second plurality of damping variances, the third plurality of input modal variances and the fourth plurality of coupling variances;

determining, by the processing system, a maximum expected reverberant response of the network of multiple inter-connected reverberant subsystems with respect to frequency using the cumulative variance; and displaying an output influenced by the maximum expected reverberant response of the network of multiple inter-connected reverberant subsystems with respect to frequency on a display device coupled to the processing system.

15. The method of claim 14, wherein determining the cumulative variance comprises combining the first plurality of excitation variances, the second plurality of damping variances, the third plurality of input modal variances and the fourth plurality of coupling variances.

16. The method of claim 14, further comprising, for each of the reverberant subsystems in the network:

obtaining a mean reverberant response associated with the respective reverberant subsystem in response to the excitation energy;

determining a cumulative variance associated with the respective reverberant subsystem based on the first variance associated with the excitation energy applied to the respective reverberant subsystem, the second variance associated with the damping provided by the respective reverberant subsystem, the third variance associated with the input modal power acceptance associated with the respective reverberant subsystem, and one or more of the coupling variances between the respective reverberant subsystem and other reverberant subsystems in the network, wherein:

determining the maximum expected reverberant response comprises determining a maximum expected value for the reverberant response for the respective reverberant subsystem based on the mean reverberant response and the cumulative variance associated with the respective reverberant subsystem; and displaying the output comprises displaying a graphical representation of the maximum expected response value for the respective reverberant subsystem on the display device.

17. The method of claim 16, further comprising selecting a probability density function for the reverberant response, wherein determining the maximum expected value comprises obtaining the maximum expected value as a percentile of the probability density function using the mean reverberant response and the cumulative variance associated with the respective reverberant subsystem.

18. The method of claim 14, wherein determining the fourth variance associated with the coupling between each respective pair of reverberant subsystems in the network comprises:

applying excitation energies to one or more reverberant subsystems in the network;

varying a characteristic of one or more of the reverberant subsystems in the network, the characteristic influencing the coupling of energy with the one or more of the reverberant subsystems, the varying of the characteristic being representative of uncertainty in the coupling of one or more pairs of the reverberant subsystems in the network;

obtaining measurement data corresponding to the reverberant energies of the reverberant subsystems in the network in response to the excitation energies while varying the characteristic; and determining the fourth variance based on the measurement data.

19. A computer-implemented method for characterizing a mean and a maximum expected response of a dynamic deterministic subsystem comprising one or more physical systems providing wave reflecting boundaries resulting in a reverberant subsystem with uncertain physical parameters and characterized by low modal density or low modal overlap when the deterministic subsystem is connected to and subject to excitation comprising at least one of electromagnetic waves or mechanical waves, the method comprising:

determining, by a processing system, one or more characteristics of the deterministic subsystem;

determining, by the processing system, the excitation applied directly to the deterministic subsystem;

generating a model of the deterministic subsystem and the excitation;

simulating operation by varying how the excitation impinges the deterministic subsystem using the model while varying a characteristic of the deterministic subsystem influencing an input modal power acceptance, resulting in simulation data representative of reverberant response energies in the deterministic subsystem, wherein the varying of the excitation and the varying of the characteristic are representative of uncertainty in the input modal power acceptance of the deterministic subsystem;

determining, by the processing system, expected energy levels of the one or more reverberant wavefield subsystems connected to the deterministic subsystem in response to the excitation based at least in part on the simulation data;

constructing, by the processing system, a numerical or mathematical model of the deterministic subsystem to calculate a complex free radiation impedance from the deterministic subsystem to each of the reverberant wavefield subsystems;

determining, by the processing system, an expected total variance of a respective expected energy level of each respective reverberant wavefield subsystem connected to the deterministic subsystem based on one or more excitation variances, damping variances, input modal variances, and coupling loss factor variances associated with the respective reverberant wavefield subsystem;

calculating, by the processing system, a mean value of a modulus-squared response of the deterministic subsystem for both directly applied deterministic excitation and for statistical excitation for each of the reverberant wavefield subsystems;

calculating, by the processing system, a variance of the modulus-squared response of the deterministic subsystem for both directly applied deterministic excitation and for statistical excitation for each of the reverberant wavefield subsystems;

obtaining, by the processing system, a probability density function for the modulus-squared response of the deterministic subsystem;

determining, by the processing system, a maximum expected modulus-squared response of the deterministic subsystem as a percentile of the probability density function using the mean value of the modulus-squared response and the variance of the modulus-squared response; and displaying the maximum expected modulus-squared response with respect to frequency on a display device coupled to the processing system.

\* \* \* \* \*